(12) United States Patent
Yamazaki et al.

(10) Patent No.: US 6,670,766 B2
(45) Date of Patent: Dec. 30, 2003

(54) PLASMA TREATMENT APPARATUS AND PLASMA TREATMENT METHOD

(75) Inventors: Keiichi Yamazaki, Nara (JP); Yukiko Inooka, Moriguchi (JP); Yasushi Sawada, Neyagawa (JP); Noriyuki Taguchi, Otsu (JP); Yoshiyuki Nakazono, Kadoma (JP); Akio Nakano, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 49 days.

(21) Appl. No.: 09/863,474

(22) Filed: May 24, 2001

(65) Prior Publication Data

US 2002/0008480 A1 Jan. 24, 2002

(30) Foreign Application Priority Data

Jun. 6, 2000 (JP) ......................................... 2000-169571

(51) Int. Cl.[7] .............................. H01J 7/24; C23C 16/00
(52) U.S. Cl. ................................ 315/111.21; 118/723 R
(58) Field of Search ....................... 315/111.21, 111.31, 315/111.41, 111.51, 111.61, 111.71, 111.81; 118/723 R, 723 MW

(56) References Cited

U.S. PATENT DOCUMENTS

| | | | | |
|---|---|---|---|---|
| 5,124,173 A | * | 6/1992 | Uchiyama et al. | 427/444 |
| 5,198,724 A | | 3/1993 | Koinuma et al. | 315/111.21 |
| 5,464,667 A | | 11/1995 | Koehler et al. | 427/577 |
| 5,585,147 A | * | 12/1996 | Ogawa et al. | 427/255.24 |
| 5,753,886 A | * | 5/1998 | Iwamura et al. | 156/345.35 |
| 5,968,377 A | * | 10/1999 | Yuasa et al. | 118/723 R |
| 6,013,153 A | * | 1/2000 | Koinuma et al. | 156/272.6 |
| 6,228,438 B1 | * | 5/2001 | Schmitt | 118/723 E |
| 6,299,948 B1 | * | 10/2001 | Gherardi et al. | 216/71 |

FOREIGN PATENT DOCUMENTS

| | | |
|---|---|---|
| JP | 61-118136 | 6/1986 |
| JP | 3-219082 | 9/1991 |
| JP | 4-212253 | 8/1992 |
| JP | 4-334543 | 11/1992 |
| JP | 4-358076 | 12/1992 |
| JP | 6-108257 | 4/1994 |
| JP | 8-107101 | 4/1996 |
| JP | 8-327959 | 12/1996 |
| JP | 9-232293 | 9/1997 |
| JP | 2000-169977 | 6/2000 |

* cited by examiner

Primary Examiner—Don Wong
Assistant Examiner—Minh D A
(74) Attorney, Agent, or Firm—Oblon, Spivak, McClelland, Maier & Neustadt, P.C.

(57) ABSTRACT

A plasma treatment apparatus and a plasma treatment method having the capability of uniformly treating an object with plasma at a high treatment speed. This apparatus includes a tubular vessel having a laterally elongated cross section, a pair of electrodes arranged such that electric flux lines develop substantially in an axial direction of the tubular vessel when one of an AC voltage and a pulse voltage is applied between the electrodes, a gas supply for supplying a streamer generation gas into the tubular vessel, a power source for applying the voltage between the electrodes to generate plural streamers of the gas in the tubular vessel, and a plasma uniformity mechanism for making the plural streamers uniform in a lateral direction of the laterally elongated cross section of the tubular vessel to provide the plasma from one end of the tubular vessel.

26 Claims, 25 Drawing Sheets

PLASMA TREATMENT APPARATUS AND PLASMA TREATMENT METHOD

BACKGROUND OF THE INVENTION

1. Field of the Invention

The present invention relates to a plasma treatment apparatus for treating an object with plasma made up of plural streamers, and plasma treatment method using the plasma, which can be used in various application fields of performing surface-cleaning or surface-modification to electronic parts and semiconductor parts, cleaning bonding portions of CSP (Chip Size Package) and BGA (Ball Grid Array) to improve bonding strength and adhesion with sealing materials, cleaning liquid-crystal panels, improving bonding properties of ACF (Anisotropic Conductive Film) with the liquid-crystal panels, improving adhesion and printing properties of film-like substrates, resist ashing, reducing and removing metal oxides on electrodes to improve bonding properties.

2. Disclosure of the Prior Art

In the past, atmospheric pressure plasma has been used to perform a surface treatment on an object. For example, surface treatments for treating an object with a plasma jet generated under atmospheric pressure are disclosed in Japanese Patent Early Publications [KOKAI] Nos. 3-219082, 4-212253, 4-334543, and 6-108257. According to these surface treatments, it is possible to accurately treat only a required region on the object with the plasma jet.

In addition, methods of efficiently treating a large-area substrate with a wide plasma jet are disclosed in Japanese Patent Early Publications [KOKAI] Nos. 4-358076 and 9-232293. In the former, a pair of electrodes having a dielectric layer are arranged in a face-to-face relation such that the dielectric layer is put between the adjacent electrodes, and glow discharge of a rare gas is stably generated under atmospheric pressure by applying a high-frequency electric power between the electrodes. A resultant liner plasma jet is injected on the object. In the latter, a pair of electrodes are arranged around the perimeter of a flat discharge tube, and a liner plasma jet is injected from one end of the discharge tube. However, when the plasma jet is spot-injected on an object such as BGA substrates (Ball Grid Array) or films having a relatively large surface area to be treated, it is needed to allow the plasma jet to scan throughout the surface of the object. In such a case, there is a problem of lowering the treatment efficiency. On the other hand, when using the linear plasma of the stable glow discharge for the surface treatment, the treatment efficiency can be improved to some extent. However, since a current density of the glow discharge plasma is relatively low, which means that a density of active species such as radicals and ions in the plasma is low, the treatment speed is not still enough to treat the large-area object.

By the way, it is generally said that glow discharge is a spatially uniform discharge over time, which has a relatively small current density and low emission brightness. As a different discharge from the glow discharge, there are streamers, each of which is an unstable filament-like discharge having a relatively larger current density and higher emission brightness than the glow discharge. Since the high current density of the streamer presents a high density of the active species, the streamers have a potential of increasing the treatment speed by a large amount.

However, the unstable discharge state of the streamers easily causes considerable variations in treatment effects. That is, the treatment speed is much higher at downstream of a generation site of the individual streamer than at downstream of a non-generation site thereof in the discharge space. The variations in treatment effects on the object caused by this difference in the treatment speed are a principal reason for preventing the application of the streamers to surface treatment technology.

In addition, when active species in plasma discharge generated in a plasma-generation chamber are released into the atmosphere, they recombine with nitrogen and oxygen, and most of them become inactive. In this case, as the time required for a plasma jet including the active species to reach a surface to be treated of an object increases, and the contact area between the plasma jet and atmospheric gases increases, the active species easily become inactive, and the treatment effects brought on the object by the plasma jet lower. Therefore, when the plasma jet has a laterally rectangular cross section, variations in treatment effects easily occur because the contact area between laterally opposite ends of the plasma jet and the atmospheric gases is larger than the contact area between the center thereof and the atmospheric gases. Moreover, when the object has projections or depressions on the surface, the time required for the plasma jet to reach the depressions is longer than the time required for the plasma jet to reach the projections, so that variations in treatment effects on the object further increase. This increase in the variations results in the deterioration of the performance of the object, e.g., a decrease in bonding reliability. Thus, it is desired to improve the uniformity of the plasma treatment.

SUMMARY OF THE INVENTION

In view of the above facts, the present invention has achieved success in practical use of a plasma surface treatment by serving the purpose of improving distribution uniformity of the plural streamers in the discharge space and uniformly treating an object with plasma made up of the plural streamers at a high treatment speed from the viewpoints of apparatus and method. Therefore, a first object of the present invention is to provide the plasma treatment apparatus for uniformly treating the object with the plasma made up of the plural streamers, which comprises:

a tubular vessel made of an electrically-insulating material and having a laterally elongated cross section, which has a gas inlet at its one end and a plasma outlet at the other end;

a pair of electrodes, which are arranged such that electric flux lines develop substantially in an axial direction of the tubular vessel when one of an AC voltage and a pulse voltage is applied between the electrodes;

a gas supply for supplying a streamer generation gas into the tubular vessel though the gas inlet;

a power source for applying one of the AC voltage and the pulse voltage between the electrodes to generate the plural streamers of the gas in the tubular vessel; and a plasma uniform means for making the plural streamers uniform in a lateral direction of the laterally elongated cross section of the tubular vessel to provide the plasma from the plasma outlet.

It is preferred that the plasma uniform means is provided by (1) the tubular vessel formed such that an aperture area of the gas inlet is smaller than a cross-sectional area immediately below the gas inlet of the tubular vessel; (2) a turbulence generating member disposed in the tubular vessel, which has a shape capable of generating a turbulence of the streamer generation gas in the tubular vessel; or (3)

the tubular vessel formed such that the laterally elongated cross section of the tubular vessel has an inner width of 1 to 5 mm.

A second object of the present invention is to provide a plasma treatment method using the plasma made up of the plural streamers and having the capability of serving the above purpose. That is, the surface treatment process comprises the following steps of:

supplying a streamer generation gas into a tubular vessel made of an electrically-insulating material and having a laterally elongated cross section, which has a gas inlet at its one end and a plasma outlet at the other end;

generating plural streamers under atmospheric pressure or a pressure near the atmospheric pressure in the tubular vessel by applying one of an AC voltage and a pulse voltage between a pair of electrodes arranged such that electric flux lines develop substantially in an axial direction of the tubular vessel;

distributing the plural streamers uniformly in a lateral direction of the laterally elongated cross section of the tubular vessel to obtain plasma in the tubular vessel; and treating an object with the plasma provided from the plasma outlet of the tubular vessel.

It is preferred that the step of making the plural streamers uniform is performed by (1) supplying the streamer generation gas into the tubular vessel such that a flow of the streamer generation gas in the tubular vessel has a Reynolds number of 1700 or more under non-discharge condition, or (2) supplying the streamer generation gas into the tubular vessel such that a flow velocity of the streamer generation gas in the axial direction of the tubular vessel is 5 m/sec or more.

A further object of the present invention is to provide a plasma treatment apparatus having a treatment-effect uniform means for uniformly carrying out a plasma treatment on the entire surface region to be treated of the object by controlling time required for a plasma jet to reach the surface region, in order to obtain uniform treatment effects on the object. That is, the plasma treatment apparatus comprises a tubular vessel made of an electrically-insulating material and having a gas inlet at its one end and a plasma outlet at the other end, a pair of electrodes, a gas supply for supplying a plasma generation gas into the tubular vessel though the gas inlet, a power source for applying one of an AC voltage and a pulse voltage between the electrodes to generate the plasma of the gas in the tubular vessel, and the treatment-effect uniform means for facilitating the uniformity of plasma-treatment effects on the object.

These and still other objects and advantages will become apparent from the following detail description of preferred embodiments and Examples of the invention, referring to the attached drawings.

DETAIL DESCRIPTION OF PREFERRED EMBODIMENTS OF THE INVENTION

The present invention provides plasma treatment apparatus and method for treating an object with plasma, which is obtained by generating plural streamers of a streamer generation gas under atmospheric pressure or a pressure near the atmospheric pressure in a tubular vessel, and making the plural streamers uniform in a direction perpendicular to an axial direction of the tubular vessel.

A preferred embodiment of the plasma treatment apparatus of the present invention is shown in FIG. 1. This apparatus comprises a tubular vessel 1, in which a discharge space is defined, a pair of electrodes 2, 3 arranged around the tubular vessel, a gas supply (not shown) for supplying a streamer generation gas into the tubular vessel, a power source 4 for applying an AC voltage or a pulse voltage between the electrodes to generate plural streamers in the tubular vessel, and a plasma uniform means for making the plural streamers uniform in the discharge space.

Figure 1A:
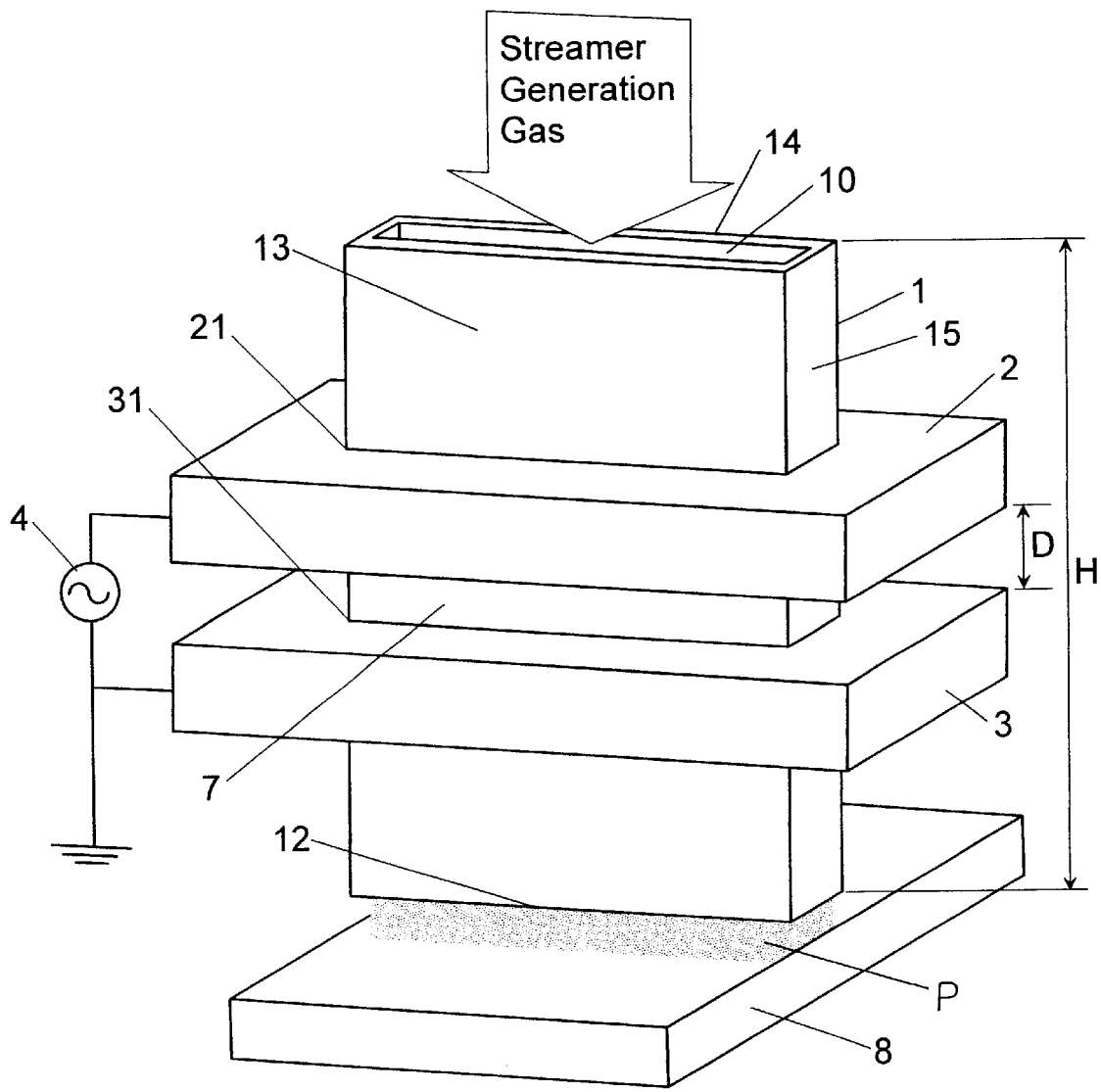
FIG. 1A is a schematic perspective view of a plasma treatment apparatus according to the present invention.
Figure 1B:
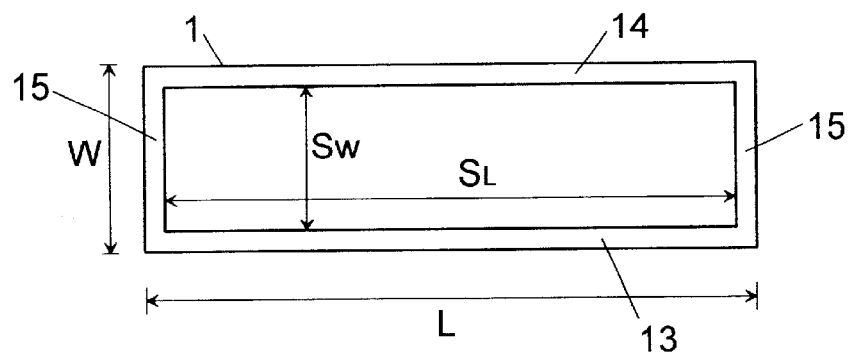
FIG. 1B is a cross-sectional view of a tubular vessel of the apparatus.

The tubular vessel 1 can be made of an electrically insulating material (dielectric material) having a high melting point such as glass-based materials or ceramic materials, e.g., quarts glass, alumina, yttria or zirconium. The tubular vessel 1 shown in FIG. 1A is of a rectangular tubular shape having a gas inlet 10 at its top end and a plasma outlet 12 at its bottom end, and formed with a pair of front and rear walls 13, 14 extending in parallel to each other, and a pair of side walls 15 extending in parallel to each other. As shown in FIG. 1B, a cross section perpendicular to an axial direction of the tubular vessel is a laterally elongated cross section defined by a length L and a width W. In FIG. 1B, "$S_W$" designates an inner width of the tubular vessel, which is named a slit width in this specification. In addition, "$S_L$" designates an inner length (i.e., an opening length in the lateral direction of the laterally elongated cross section) of the tubular vessel, which is named as a slit length in this specification. "H" designates a height of the tubular vessel. An inner space surrounded with the front, rear and side walls 13, 14, 15 of the tubular vessel is used for the discharge space 7. The streamer generation gas is introduced from the gas inlet 10 into the tubular vessel 1, and injected from the plasma outlet 12.

The electrodes 2, 3 are arranged such that electric flux lines develop substantially in the axial direction of the tubular vessel when the AC voltage or the pulse voltage is applied between the electrodes. These electrodes 2, 3 can be made of a metal material having good electrical conductivity such as copper, aluminum, brass and stainless steel having high corrosion resistance (JIS: SUS 304). Each of the electrodes is of a rectangular ring shape having a rectangular hole 21, 31 into which the tubular vessel 1 can be inserted. It is preferred that the rectangular hole is formed to insure a good fit between the tubular vessel 1 and the electrode 2, 3. The discharge space 7 is positioned in the inner space of the tubular vessel 1 and between the electrodes 2, 3. In this embodiment, the electrode 2 is electrically connected to the power source 4 to work as a high-voltage electrode, and the electrode 3 is grounded to work as a low-voltage electrode.

It is preferred that the electrodes 2, 3 are disposed near the plasma outlet 12. Since a distance between the discharge space 7 and the object 8 is decreased, it is effective to increase the treatment speed. However, as the electrodes become excessively close to the plasma outlet 12, arc discharge may be caused between the object 8 and the discharge space 7 due to a decreased distance therebetween. Therefore, it is preferred to dispose the electrodes 2, 3 near the plasma outlet 12 in such a degree that the arc discharge does not occur. In addition, to prevent thermal damage to the object 8, it is preferred to reduce a temperature of the discharge space by circulating cooling water into the electrodes.

Figure 2A:
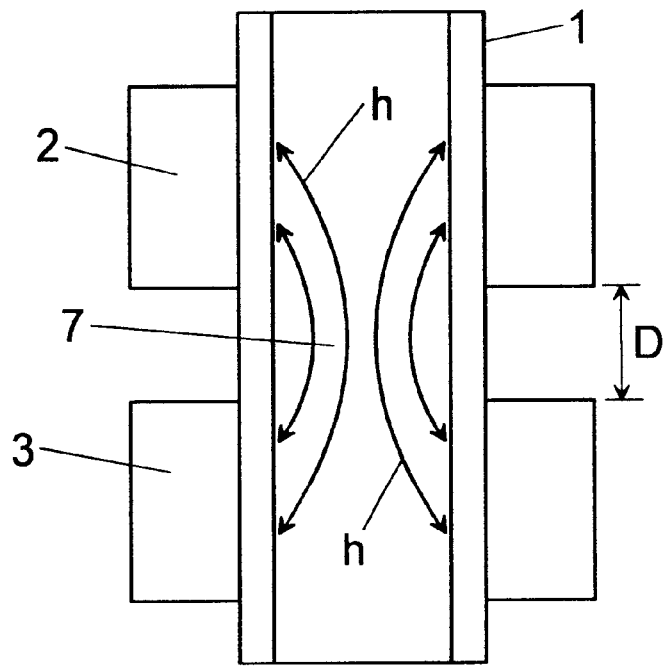
FIG. 2A is a schematic cross-sectional view showing an arrangement of electrodes for generating plural streamers.
Figure 2B:
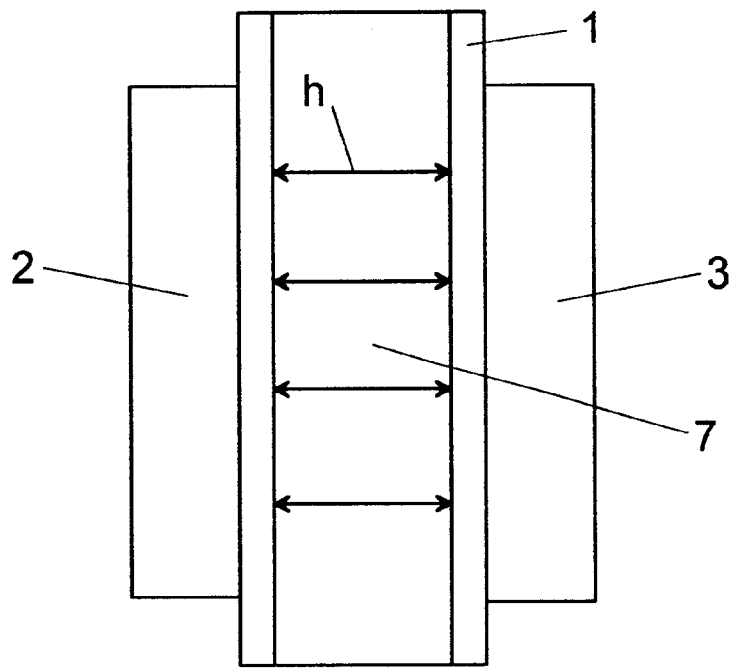
FIG. 2B is a schematic cross-sectional view showing an arrangement of electrodes for generating glow discharge.

By the way, as discharge pass is longer, which is defined by a length of the electric flux line h developed in the tubular vessel by applying the AC voltage or the pulse voltage to the discharge space through the electrodes 2, 3, the streamers are easily generated in the tubular vessel. Therefore, as shown in FIG. 2A, when the electrodes 2, 3 are arranged such that one of the electrodes is spaced from the other one in the axial direction of the tubular vessel by a required distance D described later, it is possible to provide a long discharge path. On the other hand, as shown in FIG. 2B, when the electrodes are arranged on both sides of the tubular vessel and in parallel to the axial direction of the tubular vessel, the discharge path becomes short. In this case, there is a tendency to easily generate glow discharge.

In the present invention, to simultaneously generate the plural streamers in the tubular vessel and continuously keep the streamers, it is preferred that the distance D between the electrodes 2, 3 is 2 mm or more. In this case, high current-density regions that correspond to generation sites of the streamers and low current-density regions simultaneously occur at plural sites in the discharge space, so that the simultaneous generation of plural streamers is enhanced. When the distance D is less than 2 mm, the number of the streamers may decrease due to a reduction in the discharge path. In addition, there is a tendency that spark discharge easily occurs outside of the tubular vessel 1 and between the electrodes 2, 3. At this time, it becomes difficult to obtain the streamers in the tubular vessel. To obtain a larger number of the streamers, it is particularly preferred that the distance D is 5 mm or more and less than 20 mm. When the distance D is 20 mm or more, it may be difficult to start discharge in the tubular vessel due to an increased discharge start voltage.

The plasma uniform means of the present invention is to make the plural streamers uniform in the lateral direction of the laterally elongated cross section of the tubular vessel, i.e., in a direction of the length (L) shown in FIG. 1B. It is preferred to use at least one of the following features (1) to (3) as the plasma uniform means.

Figure 3A:
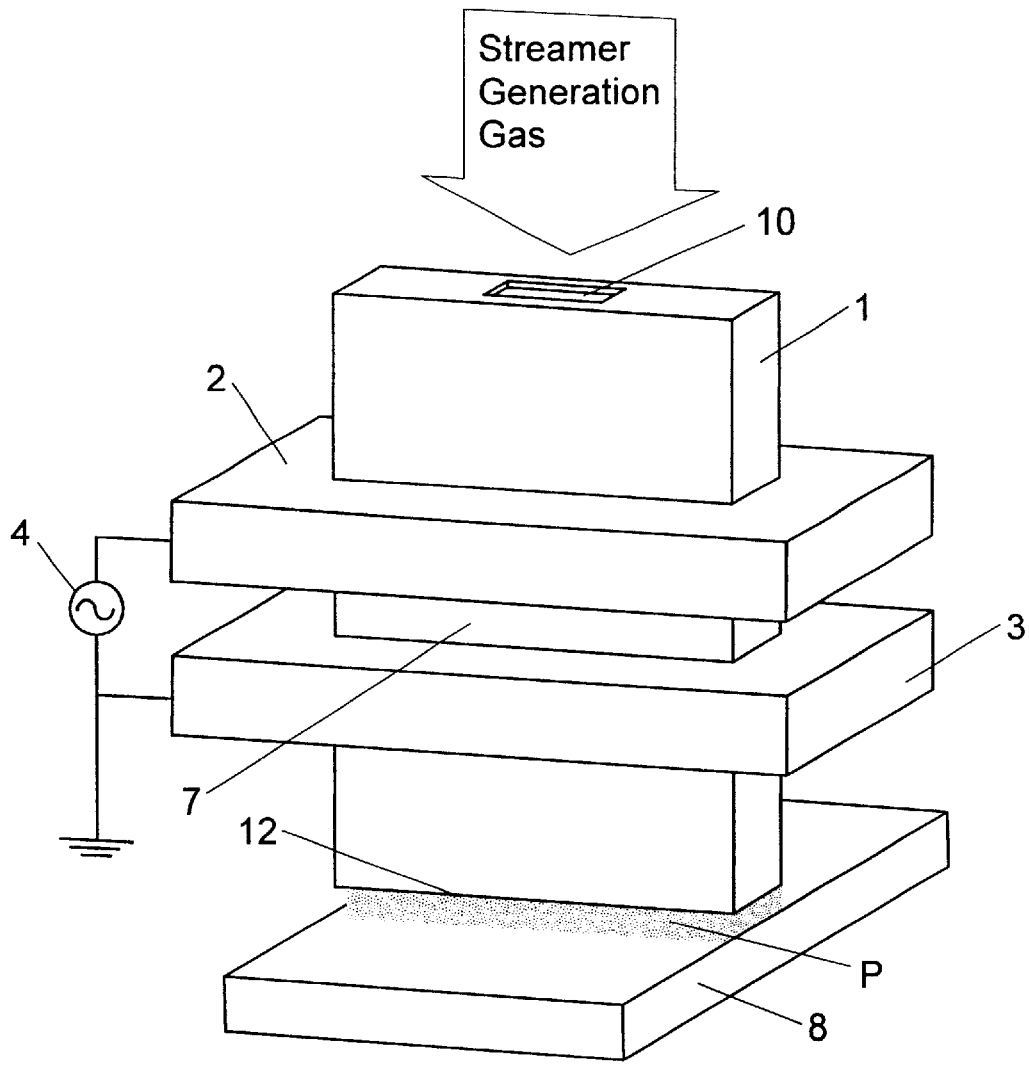
FIG. 3A is a schematic perspective view of another embodiment of the plasma treatment apparatus of the present invention.
Figures 3B, 3C:
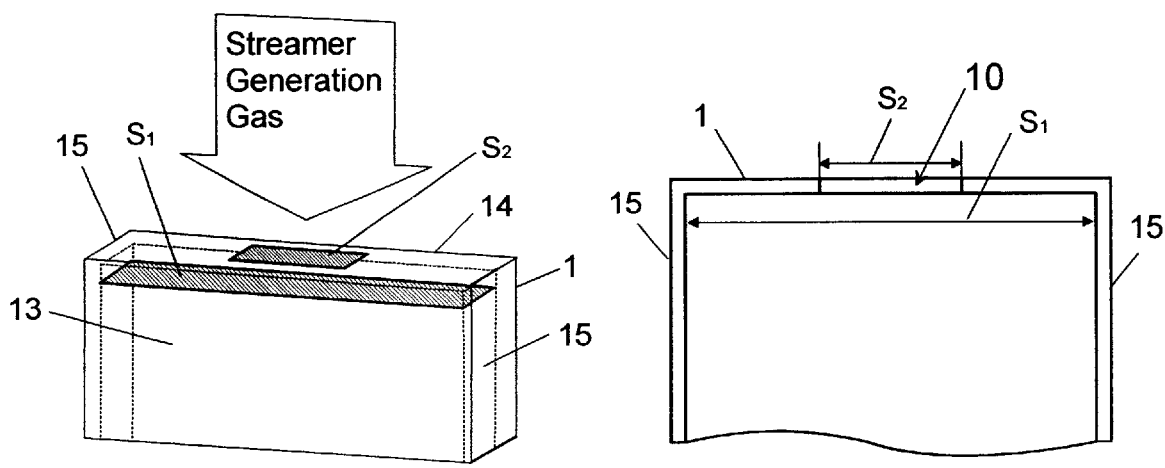
FIGS. 3B, 3C are partially perspective and partially cross-sectional views of the tubular vessel of FIG. 3A, respectively.

(1) As the tubular vessel with the plasma uniform means, as shown in FIG. 3, it is preferred to use the tubular vessel formed such that an aperture area of the gas inlet 10 is smaller than that of the plasma outlet 12. In this case, it is particularly preferred that a center of the gas inlet 10 is on the axis of the tubular vessel 1.

Figure 4:
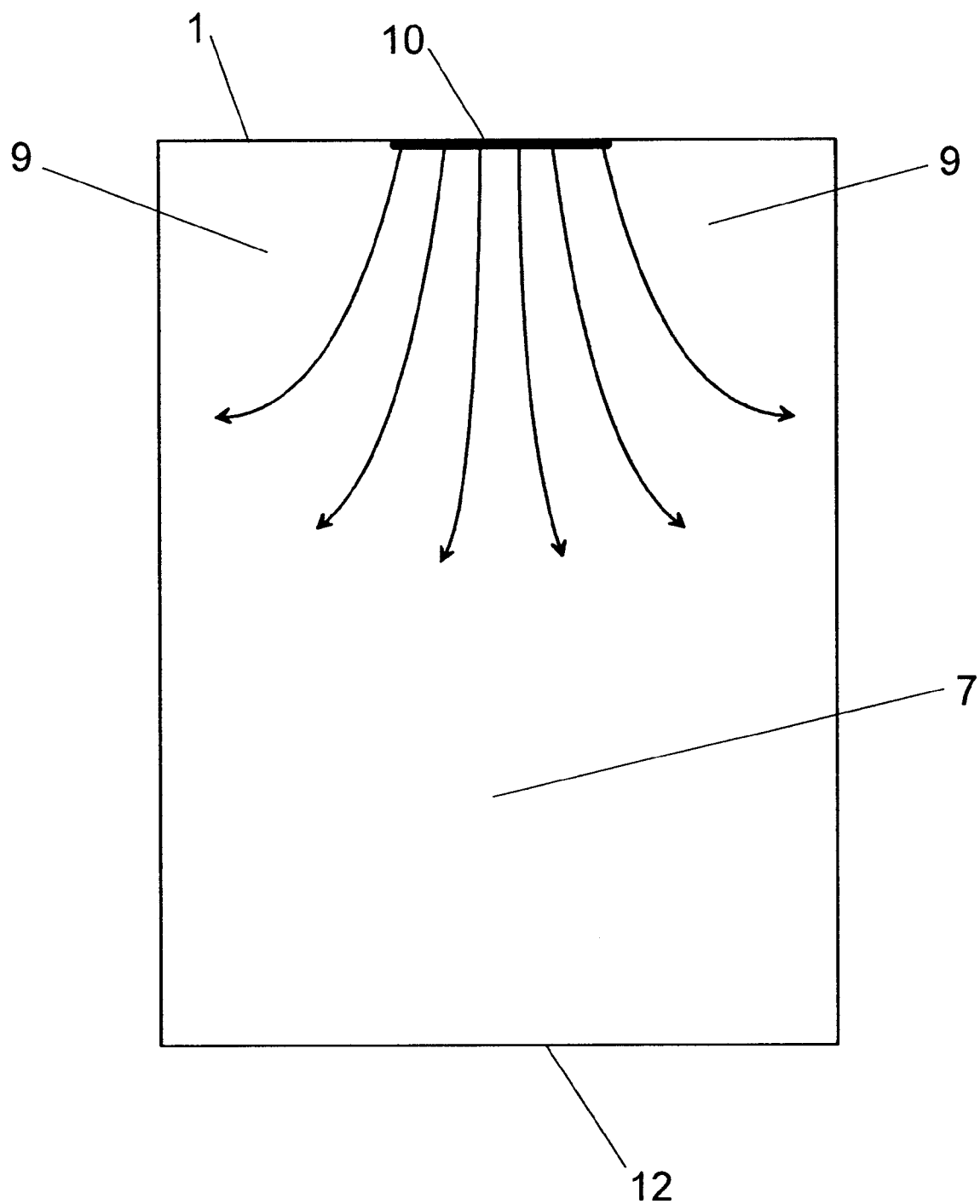
FIG. 4 is a schematic diagram illustrating a flow of a steamer generation gas in the apparatus of FIG. 3.

When using the tubular vessel 1 having such an gas inlet 10, the streamer generation gas radially diffuses from the gas inlet 10 towards the inner space 9 of the tubular vessel 1, as shown by the arrows in FIG. 4. At this time, vortex flows occur in the tubular vessel. These vortex flows facilitate the radial flow of the streamer discharge gas, so that gas-flow constituents that are not parallel to the electric flux line h increase. This provides uniform generation of the plural streamers.

Figure 5A:
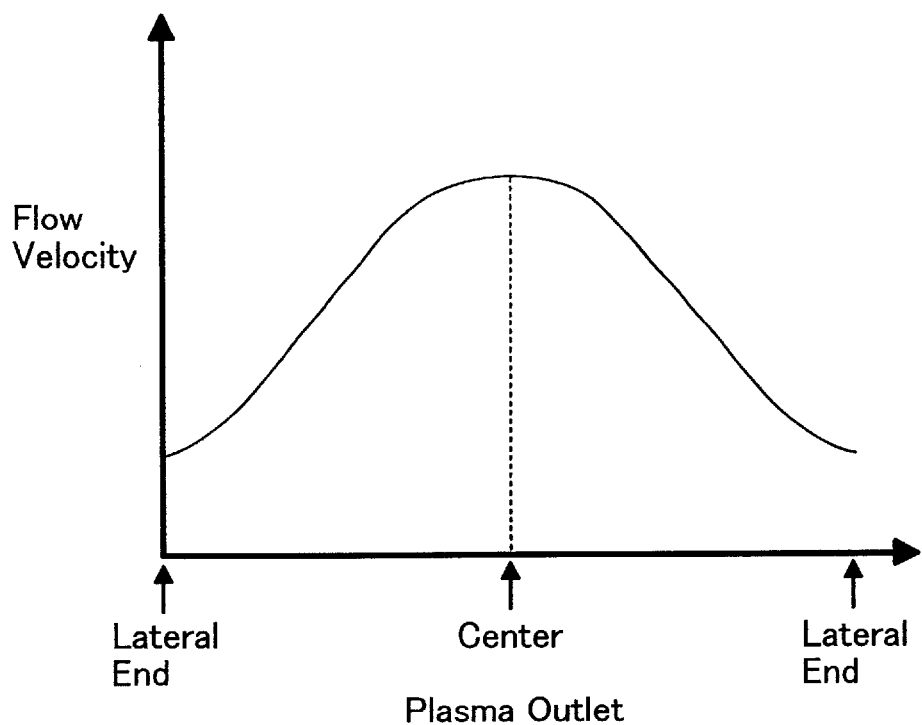
FIGS. 5A is a gas-velocity distribution diagram measured at a plasma outlet under non-discharge condition.
Figure 5B:
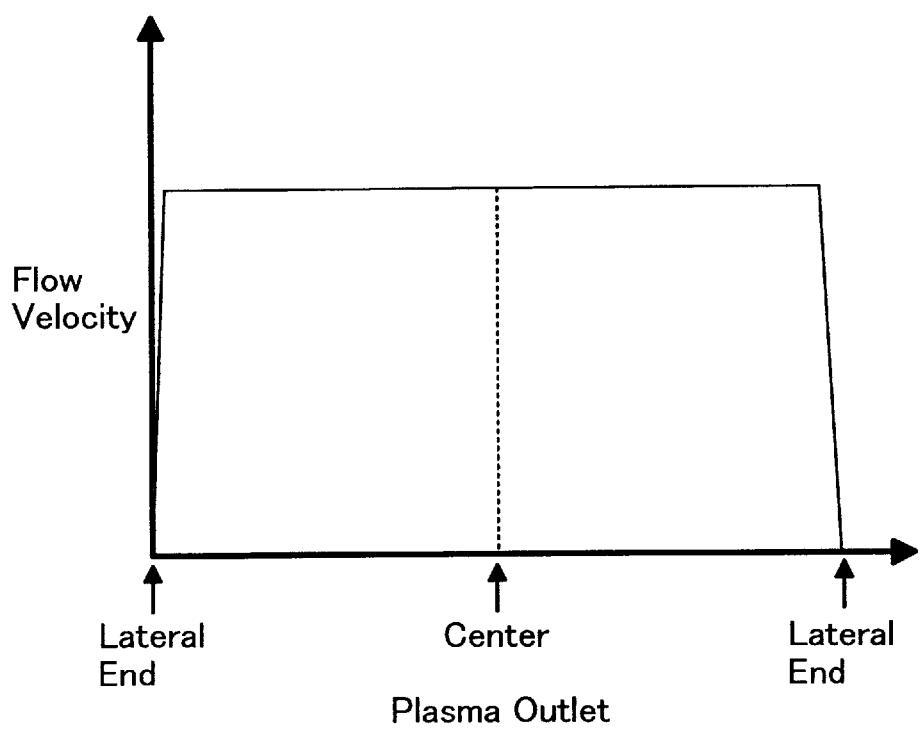
FIG. 5B is a gas-velocity distribution diagram measured at the plasma outlet under discharge condition.

In the plasma treatment apparatus using the tubular vessel shown in FIG. 3, a flow velocity of the streamer generation gas measured at a position directly below the plasma outlet 12 under non-discharge condition has a flow-velocity distribution shown in FIG. 5A, in which the flow velocity is the fastest at the substantially center (plasma outlet center) of the tubular vessel, and gradually decreases towards opposite ends (plasma outlet edge). When the streamer generation gas having the flow-velocity distribution of FIG. 5A is supplied into the discharge space under discharge condition, the flow velocity of the plasma injected from the plasma outlet 12 becomes substantially uniform in the lateral direction of the laterally elongated cross section of the tubular vessel, as shown in FIG. 5B. That is, during the discharge, a gas pressure in the discharge space increases due to thermal expansion of the gas. The increase in gas pressure brings increased resistance to gas flow. When the streamer generation gas comes into the discharge space, a proportion of gas constituents that flow from the center of the discharge space towards inner surfaces of the tubular vessel 1 increases. As a consequence, the flow velocity becomes uniform over a wider range in the lateral direction.

In such a case, to make the plural streamers uniform over the entire region in the lateral direction of the laterally elongated cross section of the tubular vessel 1 in the discharge space, it is needed to increase average flow velocity of the streamer generation gas and generate the turbulence constituents of the gas in the tubular vessel. In the present invention, by using the tubular vessel 1 formed such that the aperture area of the gas inlet 10 is smaller than that of the plasma outlet 12, it is possible to easily generate the turbulence constituents of the gas in the discharge space without increasing the supply amount of the streamer discharge gas. As a consequence, the present invention has achieved success in improving the uniformity of the streamers in the discharge space as well as reducing running costs of the plasma treatment apparatus by reducing the amount of the streamer generation gas consumed.

Figure 6A:
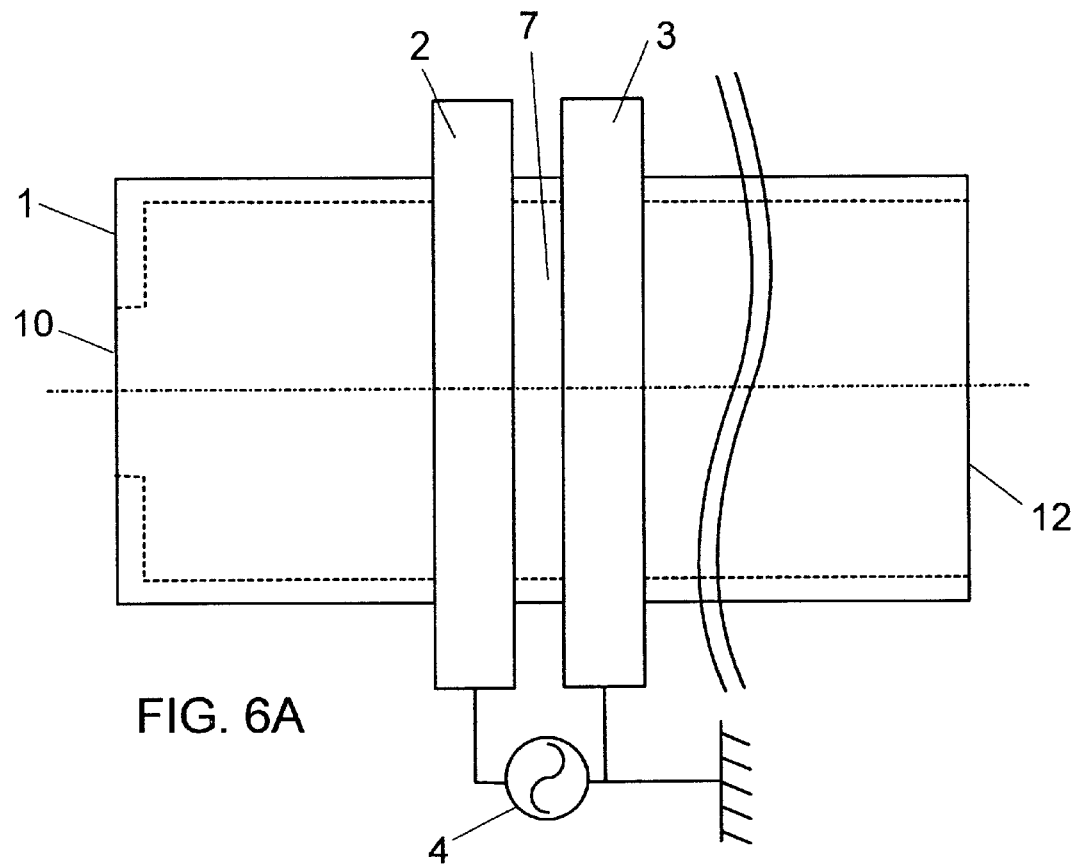
FIG. 6A is a plane view of the tubular vessel of the apparatus of FIG. 3.
Figure 6B:
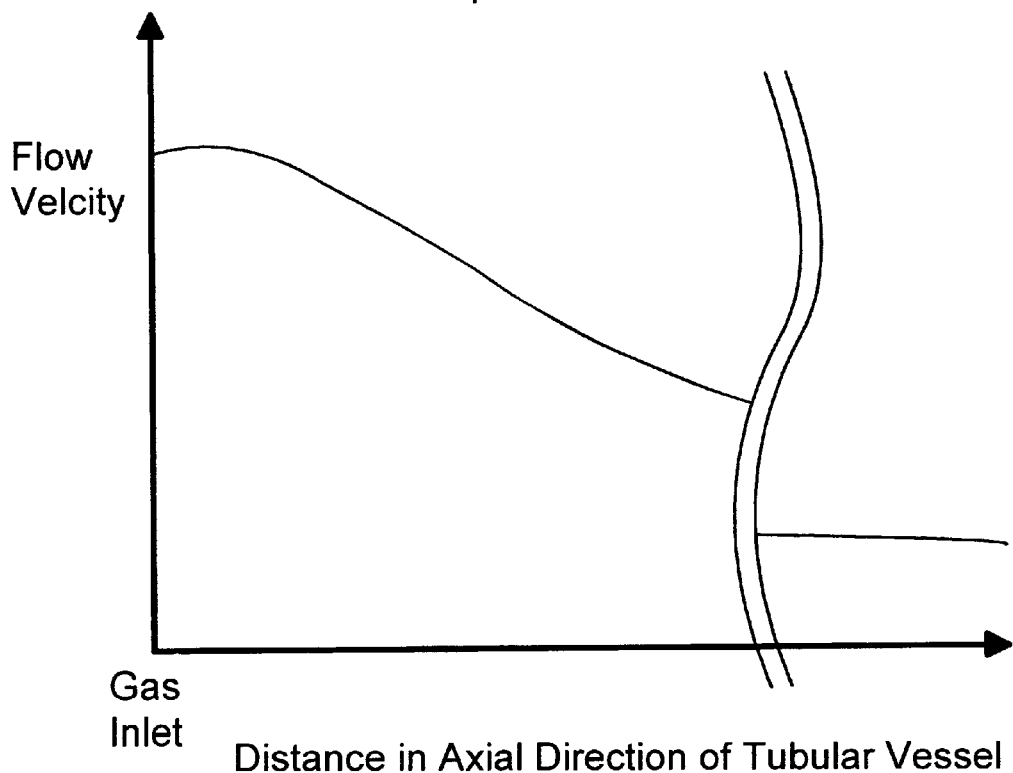
FIG. 6B is a diagram showing a change of flow velocity of the plasma generation gas in an axial direction of the tubular vessel.

As the aperture area of the gas inlet 10 is smaller, larger amounts of turbulence of the streamer generation gas are generated in the discharge space. However, when the flow velocity of the streamer generation gas excessively increases at a center portion of the discharge space, the streamers may be blown out at the center portion, so that the uniformity of treatment lowers. In addition, as shown in FIGS. 6A and 6B, as the distance between the gas inlet 10 and the discharge space increases, the influence of turbulence is difficult to reach the discharge space. As a result, the flow of the streamer generation gas substantially parallel to the electric flux line h becomes predominant, and the effects brought by using the gas inlet having the smaller aperture area than the plasma outlet may decrease. Therefore, it is preferred the tubular vessel comprises an aperture-area adjusting means for controlling the aperture area of at least one of the gas inlet and the plasma outlet to suitably set the ratio of aperture area of the gas inlet and the plasma outlet according to plasma treatment conditions such as gas flow rate.

Concretely, it is preferred that a ratio of a cross sectional area ($S_1$) immediately below the gas inlet 10 of the tubular vessel 1 and an aperture area ($S_2$) of the gas inlet 10 is within a range of $0.125 \leq S_2/S_1 \leq 0.75$. When the above ratio is less than 0.125, the flow velocity of the streamer generation gas excessively increases at the gas inlet. In this case, there is a fear that the plasma may be blown out at the center of the discharge space by the gas flow, and the uniformity of streamers in the tubular vessel lowers. When the range is more than 0.75 under the condition that the flow amount of the streamer generation gas is maintained constant, the flow velocity of the gas relatively decreases at the gas inlet, and the vortex flows may not be sufficiently supplied downstream.

Figure 7:
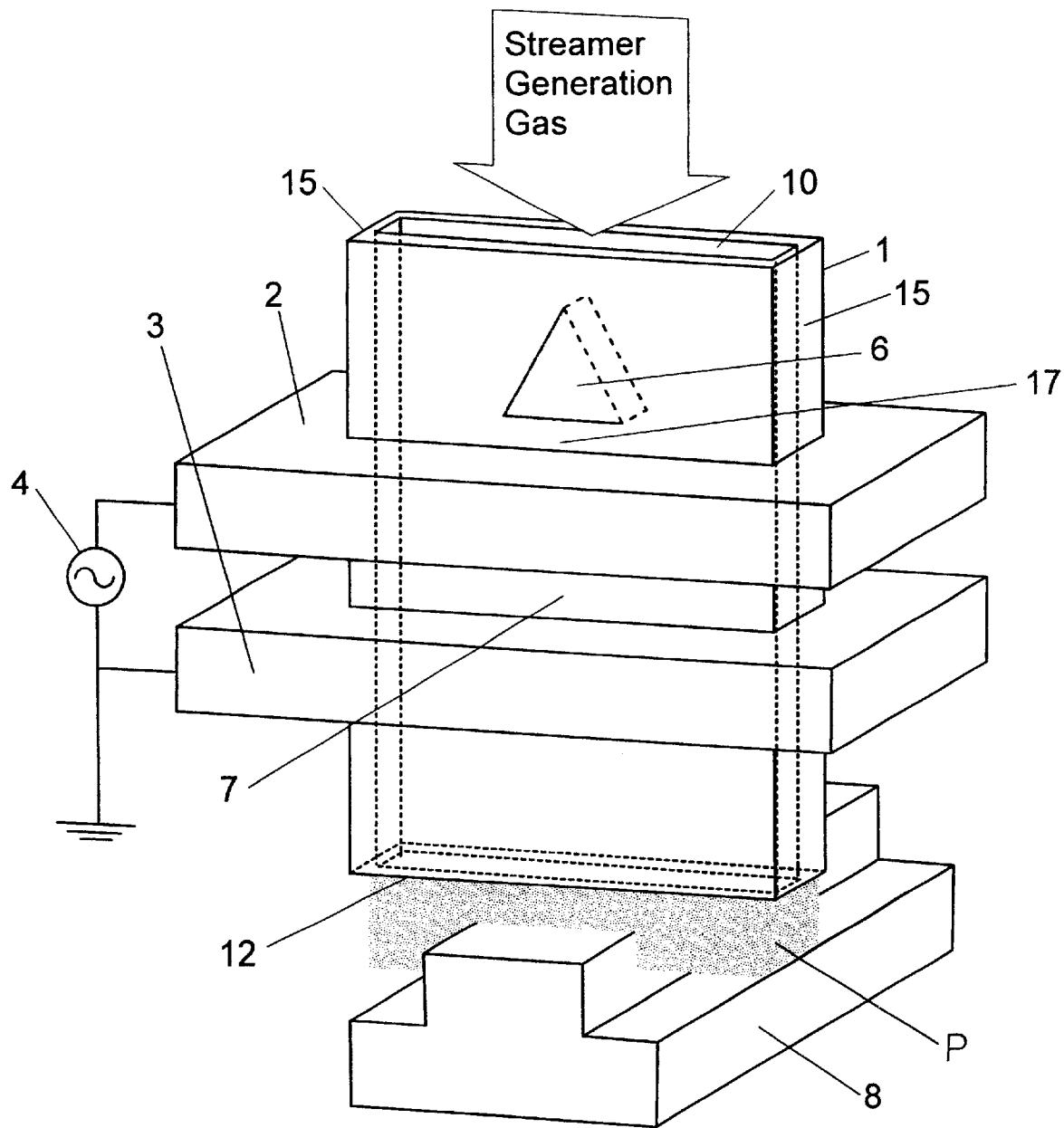
FIG. 7 is a schematic perspective view of a plasma treatment apparatus with a turbulence generating member according to the present invention.

(2) As the plasma uniform means, as shown in FIG. 7, it is also preferred to dispose a turbulence generating member in the tubular vessel, which has a shape capable of generating a turbulence of the streamer generation gas in the tubular vessel. In FIG. 7, the turbulence generating member 6 having a triangular prism is disposed at a substantially center position between the opposite side walls 15 and above the discharge space in the tubular vessel 1. In this case, when the streamer generation gas is introduced into the tubular vessel from the gas inlet 10 under non-discharge condition, vortex flows thereof occur in a space downstream of the turbulence generating member 6. These vortex flows provide large amounts of gas flow constituents in random directions as well as the direction substantially parallel to the electric flux line h. Under these circumstances, the plural streamers can be generated uniformly in the lateral direction of the laterally elongated cross section of the tubular vessel in the discharge space. Therefore, it is possible to uniformly generate plasma in the tubular vessel 1 and stably provide the uniform plasma P from the plasma outlet 12.

The turbulence generating member 6 may be disposed in the discharge space. It is important to dispose the turbulence generating member 6 such that the vortex-flow generating region including the turbulence constituents of the streamer generation gas partially overlaps with the discharge space. Shapes of the turbulence generating member 6 can be optionally designed according to conditions such as a supply amount of the streamer generation gas, a cross-sectional shape of the tubular vessel, and unevenness of a surface to be treated of the object, and so on.

(3) As the tubular vessel with the plasma uniform means, it is preferred that a distance between the inner surfaces of the front and rear walls 13, 14 of the tubular vessel 1, i.e., the slit width "$S_W$", is within a range of 1 to 5 mm. That is, when the slit width is within the above range in the plasma treatment apparatus shown in FIG. 1, it is possible to increase an average flow velocity of the streamer generation gas in the discharge space 7 without increasing the supply amount of the streamer generation gas. As a result, larger amounts of the turbulence constituents can be generated. When the slit width is less than 1 mm, the impedance of the discharge space relatively increases due to a decrease in volume of the discharge space. The increase in impedance results in a reduction in effective electric power applied to the discharge space. Therefore, in such a case, the plasma-treatment effects may deteriorate due to a decrease in plasma generation efficiency. On the other hand, when the slit width is more than 5 mm, a large supply amount of the streamer generation gas is needed to achieve a high flow velocity thereof in the tubular vessel 1. As a result, the cost performance of the plasma surface treatment may be lowered. In addition, when amounts of electric power applied to the discharge space is kept constant, a power density (an electric power per unit volume) of the discharge space 7 decreases as the slit width is wider. Therefore, there is a possibility that a sufficient treatment speed is not obtained. Thus, when the slit width "$S_W$", is within the above range, it is possible to efficiently treat the object 8 with the uniform plasma P injected from the plasma outlet 12.

When the apparatus shown in FIG. 3 has the slit width "$S_W$" of 1 to 5 mm as well as the gas inlet 10 having the smaller aperture are than the plasma outlet 12, a synergistic effect of the plasma uniform means can be obtained. That is, since the average flow velocity of the streamer generation gas is increased at the gas inlet 10, and the vortex-flow generating region is extended in the downstream direction, it is possible to facilitate the supply of the turbulence constituents into the discharge space. Similarly, when the apparatus shown in FIG. 7 has the slit width "$S_W$" of 1 to 5 mm as well as the turbulence generating member 6 disposed in the tubular vessel 1, a synergistic effect of the plasma uniform means can be obtained. In this case, the similar effects described above can be obtained.

It is preferred that the plasma treatment apparatus of the present invention comprises a treatment-effect uniform means for facilitating the uniformity of plasma-treatment effects, even when a surface to be treated of the object has projections and depressions. For example, in the case of injecting the plasma from the tubular vessel 1 of a typical rectangular shape (FIG. 1) to such an object 8, the time required for the plasma injected from the plasma outlet 12 to reach a projection on the surface is shorter than the time required for the plasma injected from the plasma outlet to reach a depression of the surface. Therefore, variations in the plasma reaching time occur with reference to a surface shape of the object. Therefore, a purpose of the treatment-effect uniform means of the present invention is to control a distribution of the plasma arriving time in the lateral direction of the laterally elongated cross section of the plasma jet injected from the plasma outlet 12. Concretely, the treatment-effect uniform means has the capability of controlling the flow velocity of the plasma jet in the lateral direction, or a distance between the plasma outlet 12 and the surface to be treated of the object 8, which is named as an irradiation distance in this specification.

Figure 8:
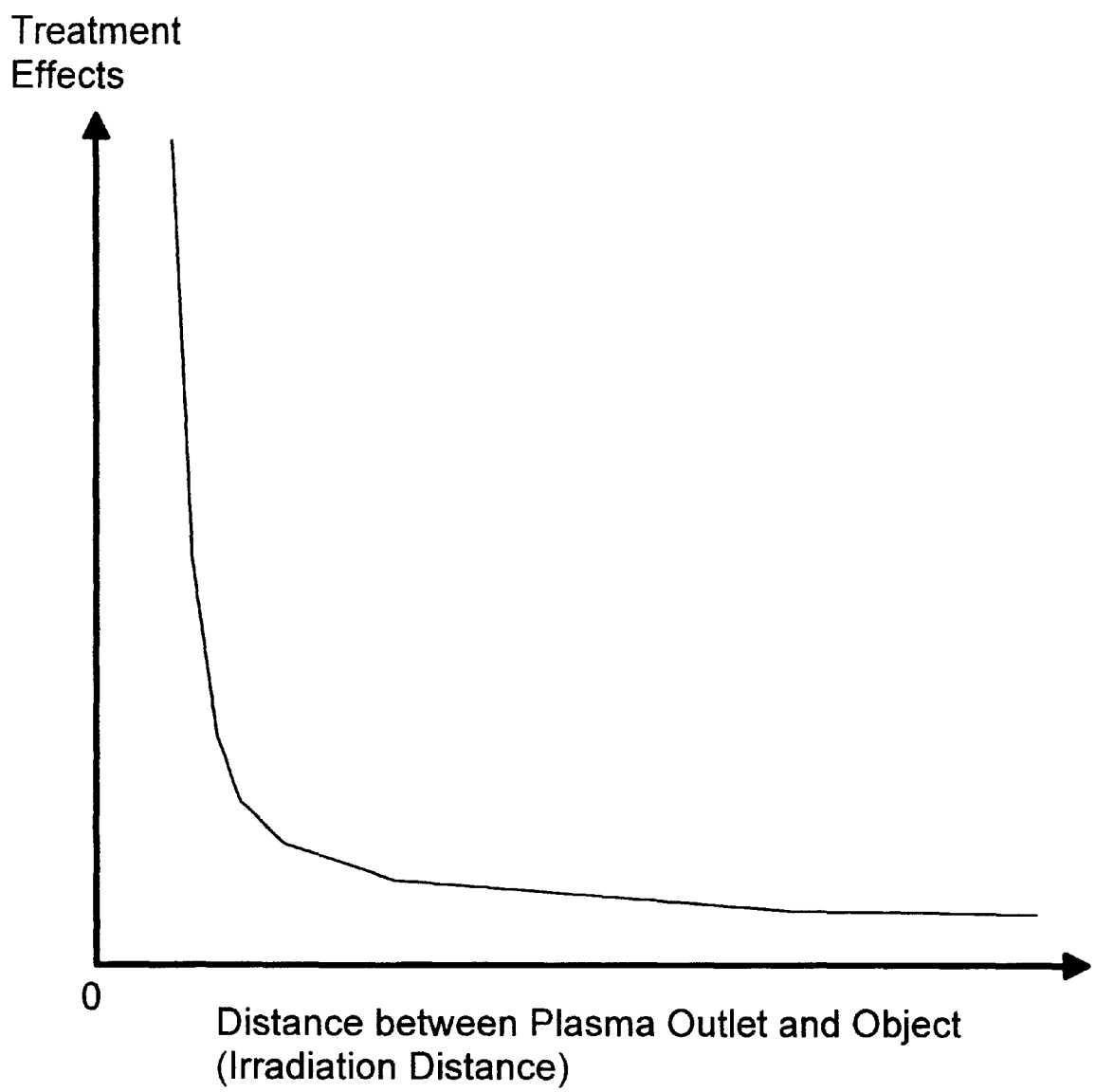
FIG. 8 is a graph showing a relation between treatment effects and a distance (irradiation distance) between the plasma outlet and an object to be treated.

As shown in FIG. 8, there is a tendency that the treatment effects decay exponentially with an increase in the irradiation distance. On the other hand, in the case of treating the object having electrical conductivity, as the irradiation distance is smaller, arc discharge may easily occur between the discharge space 7 and the object 8. Therefore, it is important to ensure the irradiation distance required to prevent the arc discharge. Thus, to further improve the uniformity of the plasma treatment effects, it is needed to select an adequate treatment-effect uniform means with reference to the surface shape to be treated and material properties of the object.

In the present invention, it is preferred to use one of the following treatment-uniform means (a) to (g) or a combination thereof.

(a) It is preferred to use the tubular vessel formed such that a height (H) of the tubular vessel 1 changes in the lateral direction of the laterally elongated cross section of the tubular vessel with reference to unevenness (凸凹) of a surface to be treated of the object.

Figure 9:
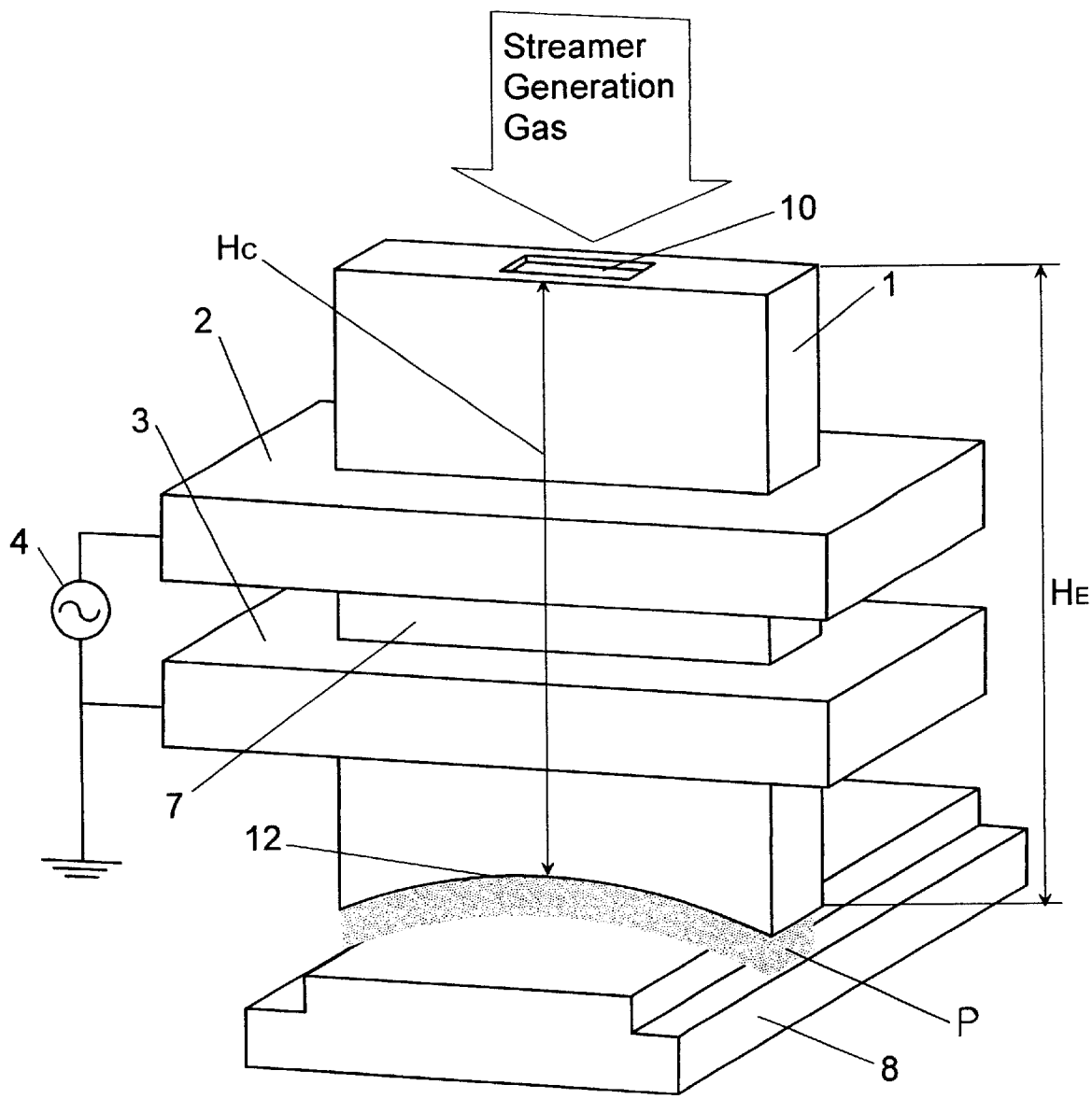
FIG. 9 is a schematic perspective view of a plasma treatment apparatus with a treatment-effect uniform means according to the present invention.

As an example, as shown in FIG. 9, the tubular vessel 1 has a change in height (H), which is larger towards lateral opposite ends ($H_E$) than at the lateral center thereof ($H_C$). When the plasma P is injected from the plasma outlet 12 of this tubular vessel to a flat surface of the object 8, the irradiation distance, i.e., the distance between the plasma outlet 12 and the object 8, smoothly decreases towards the lateral opposite ends. In this case, amounts of active species attainable to the object's surface are larger at the lateral opposite ends than at the lateral center of the tubular vessel. Therefore, even when the plasma P is injected to the flat surface of the object spaced from the plasma outlet 12 by an increased irradiation distance, or a surface to be treated of the object 8 has a convex shape, as shown in FIG. 9, it is possible to uniformly carry out the plasma treatment on those objects by use of this tubular vessel 1. In other words, as compared with the tubular vessel not having the treatment-effect uniform means, it is possible to prevent inactivation of the active species at lateral opposite ends of the plasma injected from the plasma outlet 12, and provide uniform plasma treatment.

Figure 10:
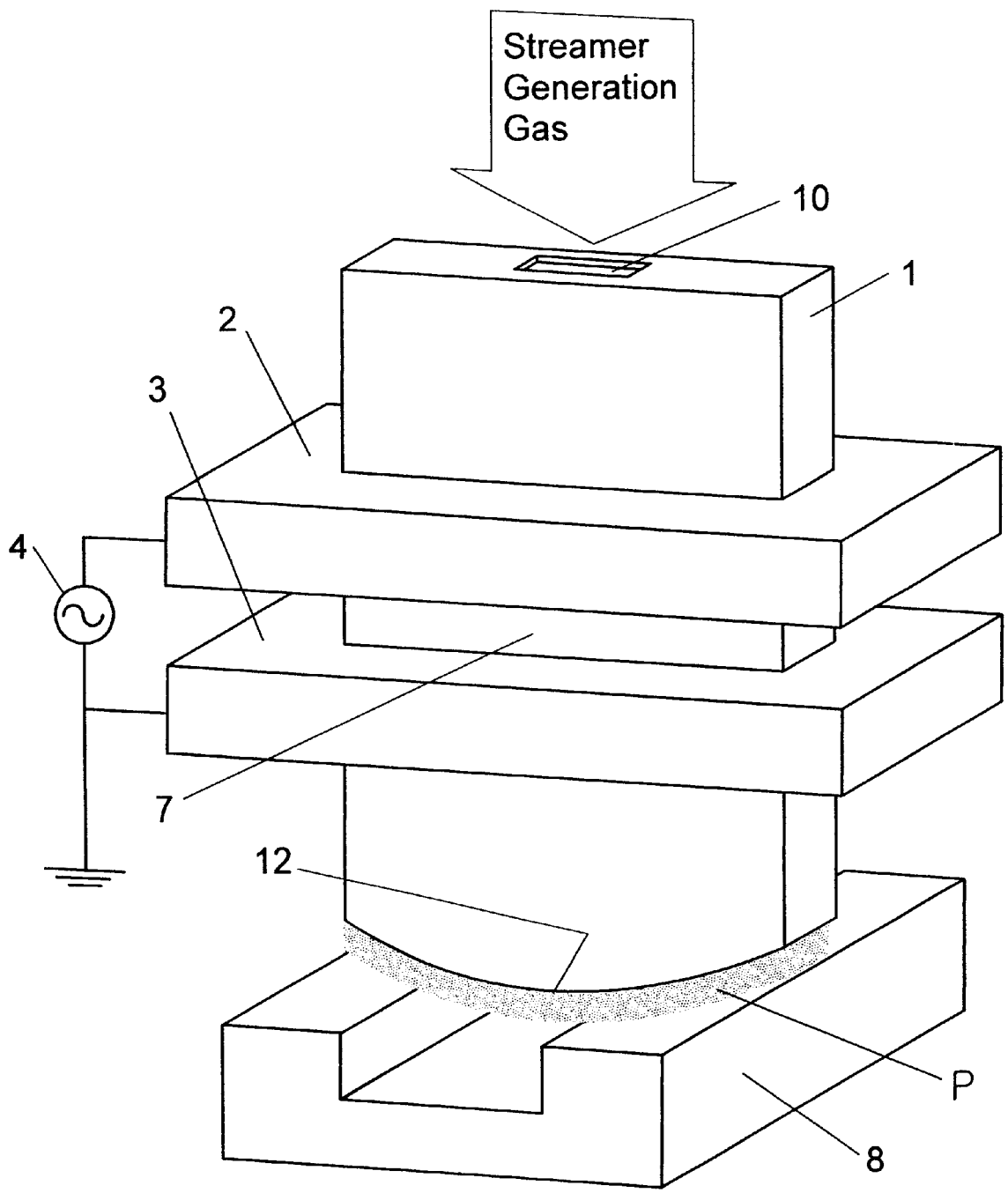
FIG. 10 is a schematic perspective view of a plasma treatment apparatus with another treatment-effect uniform means according to the present invention.

In addition, as shown in FIG. 10, the tubular vessel 1 may be formed to have a change in height (H), which is smaller towards lateral opposite ends ($H_E$) than at the lateral center thereof ($H_C$). When the plasma P is injected from the plasma outlet 12 of this tubular vessel to a flat surface of the object 8, the irradiation distance smoothly decreases towards the lateral center of the plasma outlet 12. In this case, amounts of active species attainable to the object's surface are larger at the lateral center than at the lateral opposite ends of the tubular vessel. Therefore, even when the plasma P is injected to the flat surface of the object spaced from the plasma outlet 12 by an increased irradiation distance, or a surface to be treated of the object 8 has a concave shape, as shown in FIG. 10, it is possible to uniformly perform the plasma treatment on those objects by use of this tubular vessel 1. In other words, as compared with the tubular vessel not having the treatment-effect uniform means, it is possible to prevent inactivation of the active species at lateral center of the plasma injected from the plasma outlet 12, and provide uniform plasma treatment. A degree of the height change in the lateral direction of the tubular vessel 1 can be determined with reference to the surface shape of the object.

(b) It is preferred to use the tubular vessel 1 having at least two of the gas inlets formed such that the streamer generation gas injected from the plasma outlet 12 has a flow velocity distribution determined according to unevenness of a surface to be treated of the object.

Figure 11:
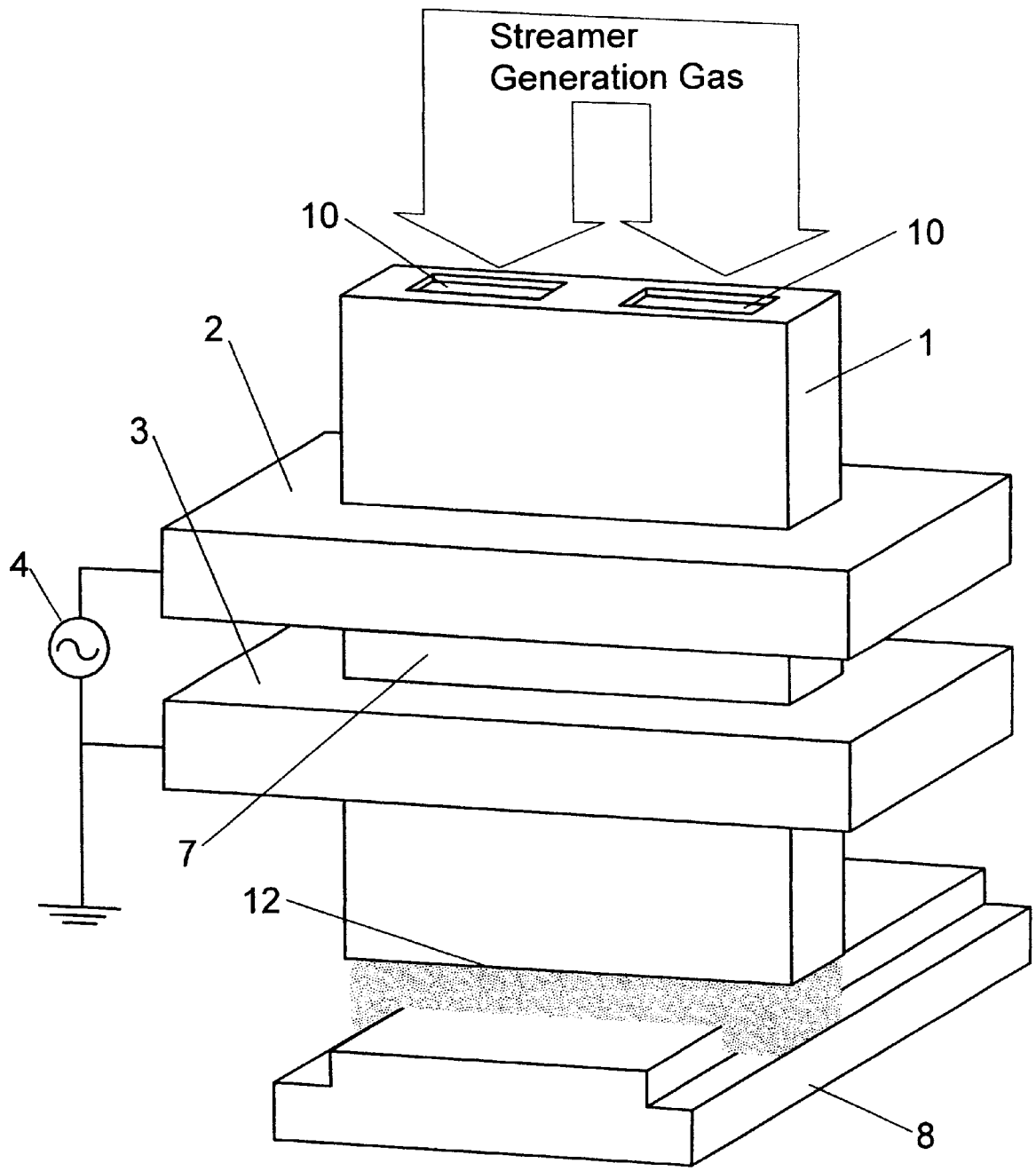
FIG. 11 is a schematic perspective view of a plasma treatment apparatus with another treatment-effect uniform means according to the present invention.
Figure 12:
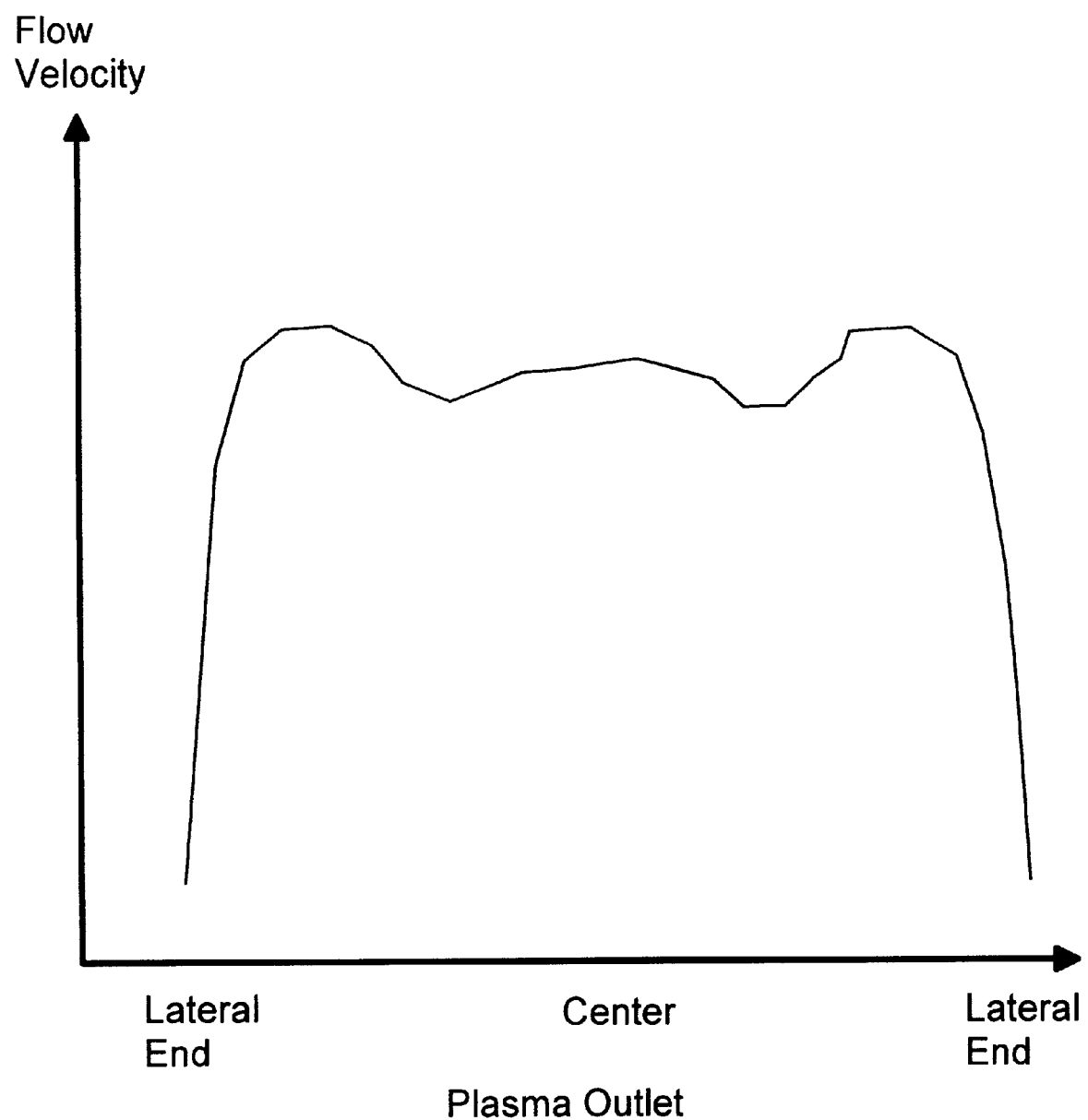
FIG. 12 is a gas-velocity distribution diagram measured at a plasma outlet of the apparatus of FIG. 11.

As an example, as shown in FIG. 11, a pair of gas inlets 10 can be formed at a top-end of tubular vessel to be symmetric with respect to a center axis of the tubular vessel 1. In this case, a flow velocity of the streamer generation measured directly below the plasma outlet 12 under non-discharge condition has a distribution in the lateral direction of the elongated cross section of the tubular vessel, as shown in FIG. 12. It shows that the flow velocity is higher at the lateral opposite ends of the plasma outlet than at the lateral center thereof. Therefore, when the plasma is injected from the plasma outlet 12 of this tubular vessel to a flat surface of the object 8, the time required for the plasma injected from the lateral opposite ends of the plasma outlet to reach the flat surface of the object is shorter than the time required for the plasma injected from the lateral center thereof to reach the flat surface of the object. As a result, even when the plasma is injected to the flat surface of the object spaced from the plasma outlet 12 by an increased irradiation distance, or a surface of the object 8 has a convex shape, as shown in FIG. 11, it is possible to uniformly perform the plasma treatment on those objects by use of this tubular vessel 1. The number of gas inlets, the position and aperture area of each of the gas inlets can be determined according to the surface shape of the object and so on.

(c) As the tubular vessel 1 with the treatment-effect uniform means, it is preferred to use the tubular vessel formed such that a cross-sectional area perpendicular to the axial direction of the tubular vessel changes in the axial direction thereof.

Figure 13:
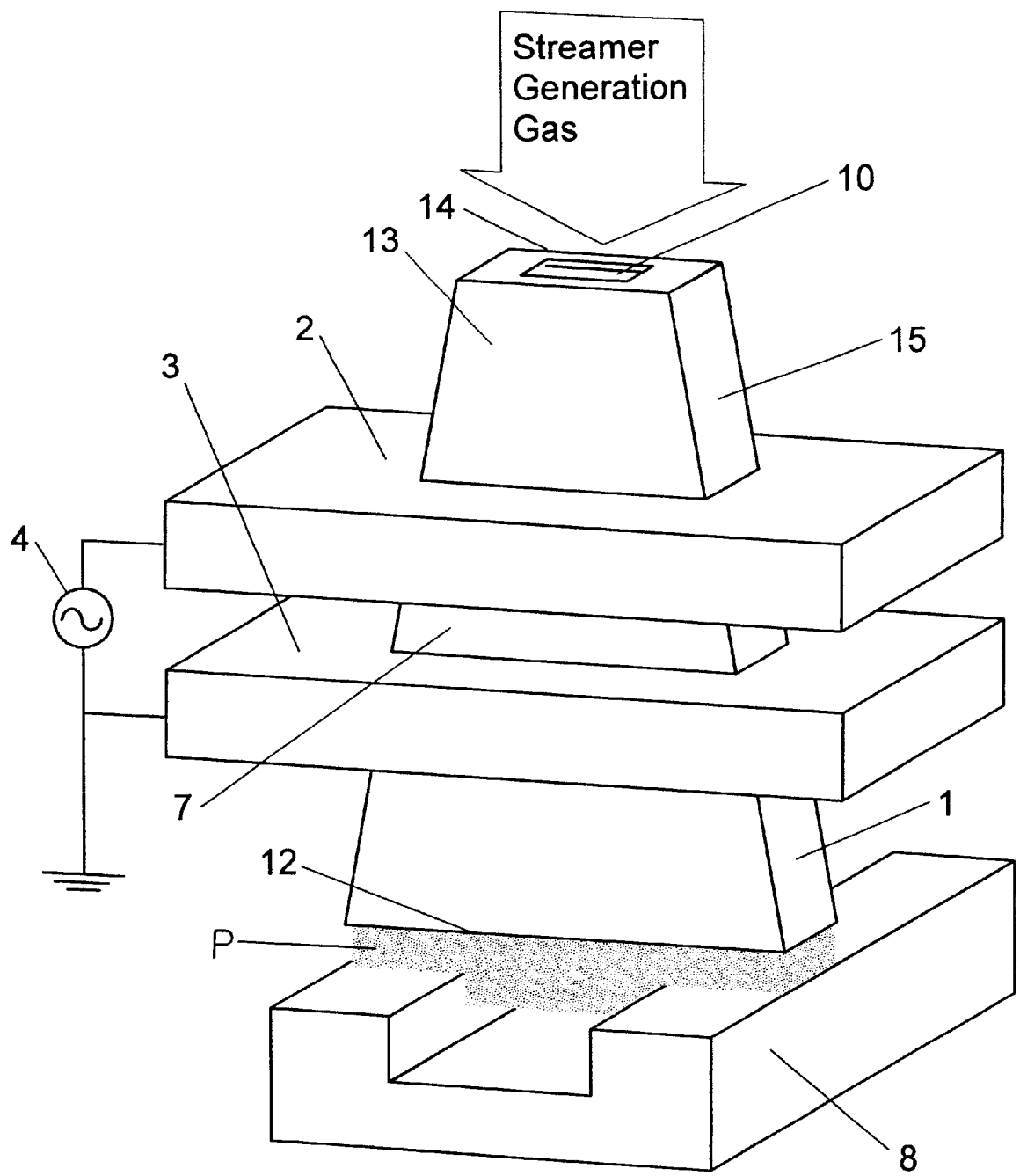
FIG. 13 is a schematic perspective view of a plasma treatment apparatus with another treatment-effect uniform means according to the present invention.

As an example, FIG. 13 shows the tubular vessel formed with a pair of front and rear walls 13, 14 of an isosceles-trapezoid shape and a pair of side walls 15 of a rectangular shape such that the cross-sectional area (slit cross-sectional area) perpendicular to the axial direction of the tubular vessel gradually increases towards the plasma outlet 12. In this case, amounts of gas-flow constituents towards the lateral opposite ends of the tubular vessel decreases, so that the flow velocity is higher at the lateral center of the plasma outlet 12 than at the lateral opposite ends thereof. Therefore, when the plasma P is injected from the plasma outlet 12 of this tubular vessel to a flat surface of the object 8, the time required for the plasma injected from the lateral center of the plasma outlet 12 to reach the flat surface of the object is shorter than the time required for the plasma injected from the lateral opposite ends thereof to reach the flat surface of the object. As a consequence, even when a surface to be treated of the object 8 has a concave shape, as shown in FIG. 13, it is possible to uniformly perform the plasma treatment on such an object by use of this tubular vessel 1. A magnitude of the flow velocity of the streamer generation gas injected from the lateral center of the plasma outlet can be adjusted by changing a side-wall inclination angle defined as an angle between the side wall and the axial direction of the tubular vessel. As the side-wall inclination angle increases, the flow velocity is higher at the lateral center of the plasma outlet 12.

(d) As the tubular vessel with the treatment-effect uniform means, it is preferred to use the tubular vessel having a surface-roughened region formed on its inner surface such that the streamer generation gas injected from the plasma outlet has a flow velocity distribution determined according to unevenness of a surface to be treated of the object.

Figure 14A:
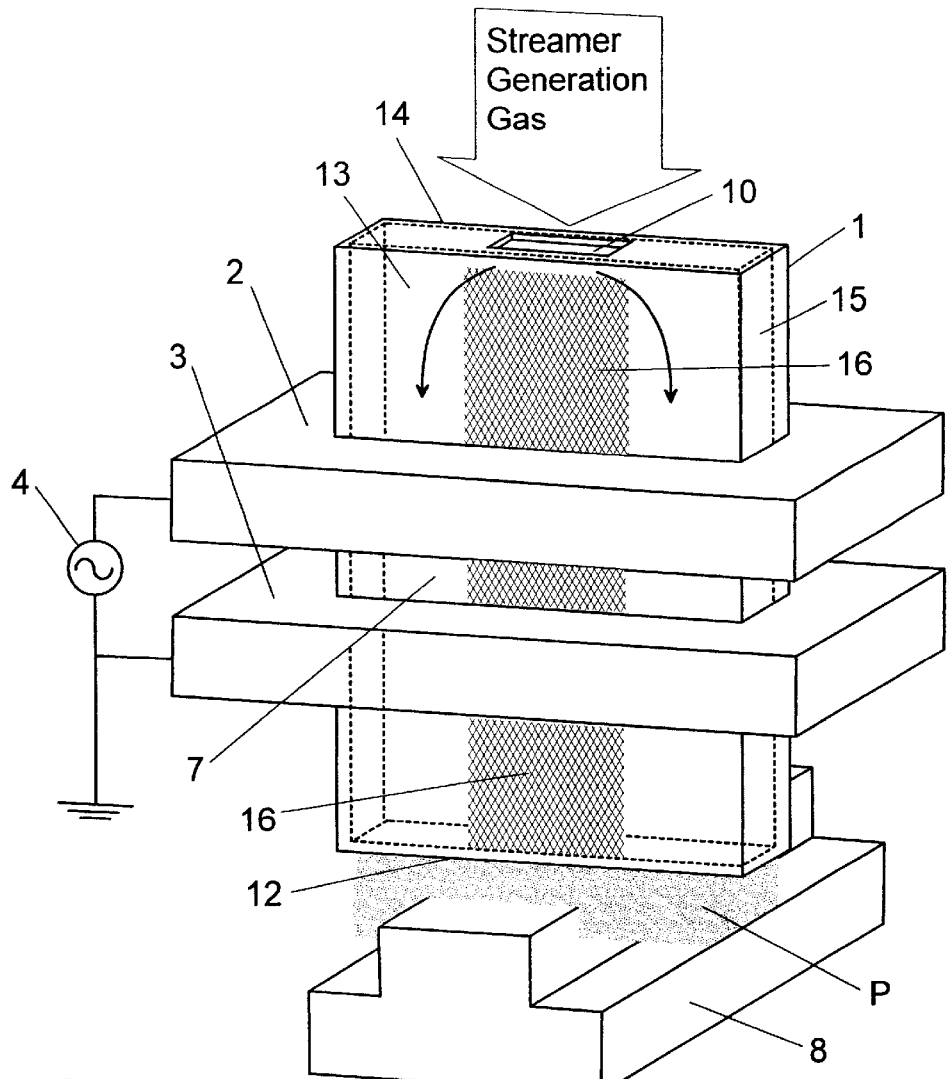
FIG. 14A is a schematic perspective view of a plasma treatment apparatus with a tubular vessel having surface-roughened regions as the treatment-effect uniform means with another treatment-effect uniform means according to the present invention.
Figure 14B:
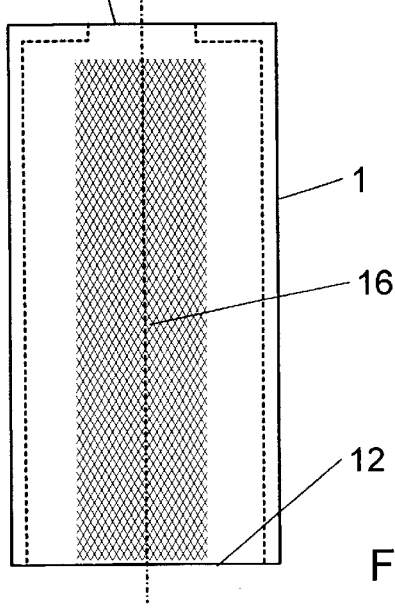
FIG. 14B is a plan view of the tubular vessel.

As an example, FIGS. 14A and 14B show the tubular vessel having the surface-roughened regions 16 each having a predetermined horizontal width, which are formed on inner surfaces of front and rear walls 13, 14 thereof to extend from directly below the gas inlet 10 to directly above the plasma outlet 12 by a vertical length. In this case, since the surface-roughened region 16 works as a resistance to gas flow, the streamer generation gas easily flows so as to avoid the surface-roughened region, as shown by the arrows in FIG. 14A. It means that the flow velocity is higher at the lateral opposite ends of the plasma outlet than at the lateral center thereof. Therefore, when the plasma P is injected from the plasma outlet 12 of this tubular vessel to a flat surface of the object 8, the time required for the plasma injected from the lateral opposite ends of the plasma outlet 12 to reach the flat surface of the object is shorter than the time required for the plasma injected from the lateral center thereof to reach the flat surface of the object. As a consequence, even when the plasma P is injected to the flat surface of the object spaced from the plasma outlet 12 by an increased irradiation distance, or a surface to be treated of the object 8 has a convex shape, as shown in FIG. 14A, it is possible to uniformly perform the plasma treatment on those objects by use of this tubular vessel 1. The number, surface area, and position of the surface-roughened region 16 formed on the inner surface of the tubular vessel can be optionally determined according to the surface shape of the object 8.

(e) As the tubular vessel 1 with the treatment-effect uniform means, it is preferred to use the tubular vessel having a cross-sectional shape perpendicular to the axial direction thereof, which is formed such that the streamer generation gas injected from the plasma outlet has a flow velocity distribution determined according to unevenness of a surface to be treated of the object.

Figure 15A:
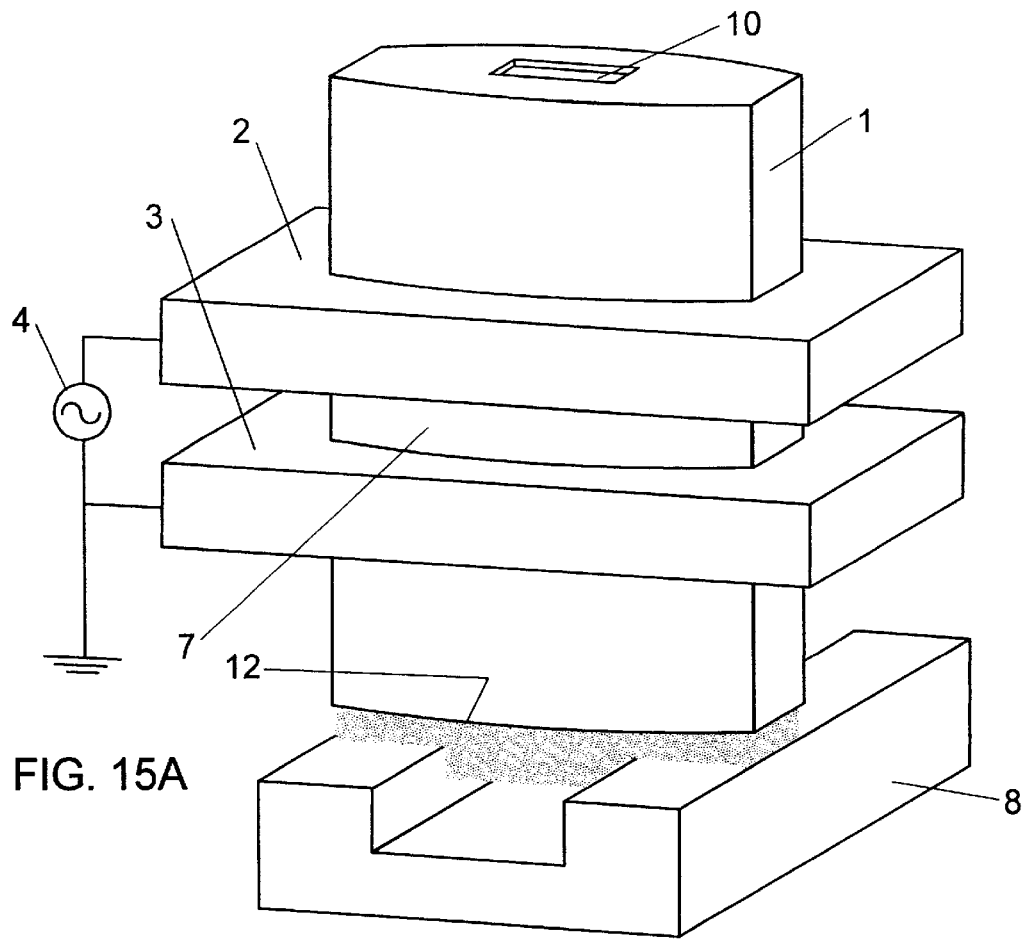
FIG. 15A is a schematic perspective view of a plasma treatment apparatus with a treatment-effect uniform means according to the present invention.
Figure 15B:
FIG. 15B is a cross-sectional view of a tubular vessel of the apparatus.
Figure 15E:
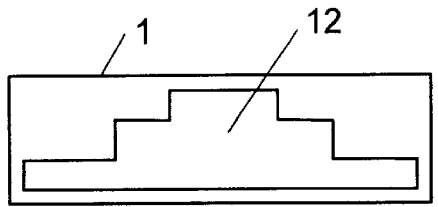
FIGS. 15C to 15G are cross-sectional views of another tubular vessels of the present invention.
Figure 15C:
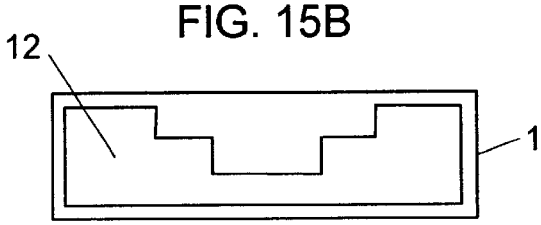
Figure 15F:
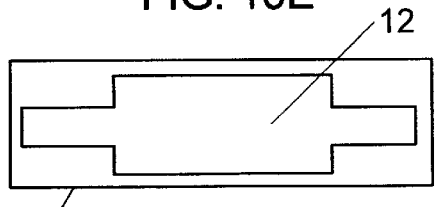
Figure 15D:
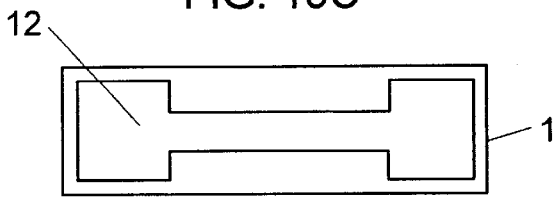
Figure 15G:
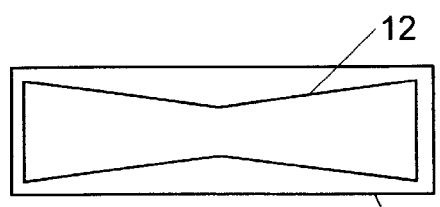

As an example, FIGS. 15A and 15B show the tubular vessel 1 formed such that a slit width "$S_W$" of the tubular vessel increased from opposite ends in the lateral direction of the laterally elongated cross section of the tubular vessel toward the center thereof. In this case, since the streamer generation gas easily flows into a region having small resistance to gas flow, the flow velocity is the higher at the lateral center of the plasma outlet 12 having the maximum slit width than at the lateral opposite ends having the minimum slit width thereof. Therefore, when the plasma is injected from the plasma outlet 12 of this tubular vessel to a flat surface of the object 8, the time required for the plasma injected from the lateral center of the plasma outlet 12 to reach the flat surface of the object is shorter than the time required for the plasma injected from the lateral opposite ends thereof to reach the flat surface of the object. As a consequence, even when a surface to be treated of the object 8 has a concave shape, as shown in FIG. 15A, it is possible to uniformly perform the plasma treatment on those objects by use of this tubular vessel 1. FIGS. 15C to 15F shows cross-sectional shapes of tubular vessels according to another preferred embodiments of the present invention.

(f) As the tubular vessel 1 with the treatment-effect uniform means, it is preferred to use the tubular vessel formed with a pair of front and rear walls 13, 14 of an isosceles-trapezoid shape and a pair of side walls 15 of a rectangular shape, so that a cross-sectional area perpendicular to the axial direction of the tubular vessel gradually decreases towards the plasma outlet 12, and an angle defined between the axial direction of the tubular vessel and the side wall is within a range of 2 to 30 degrees.

Figure 16A:
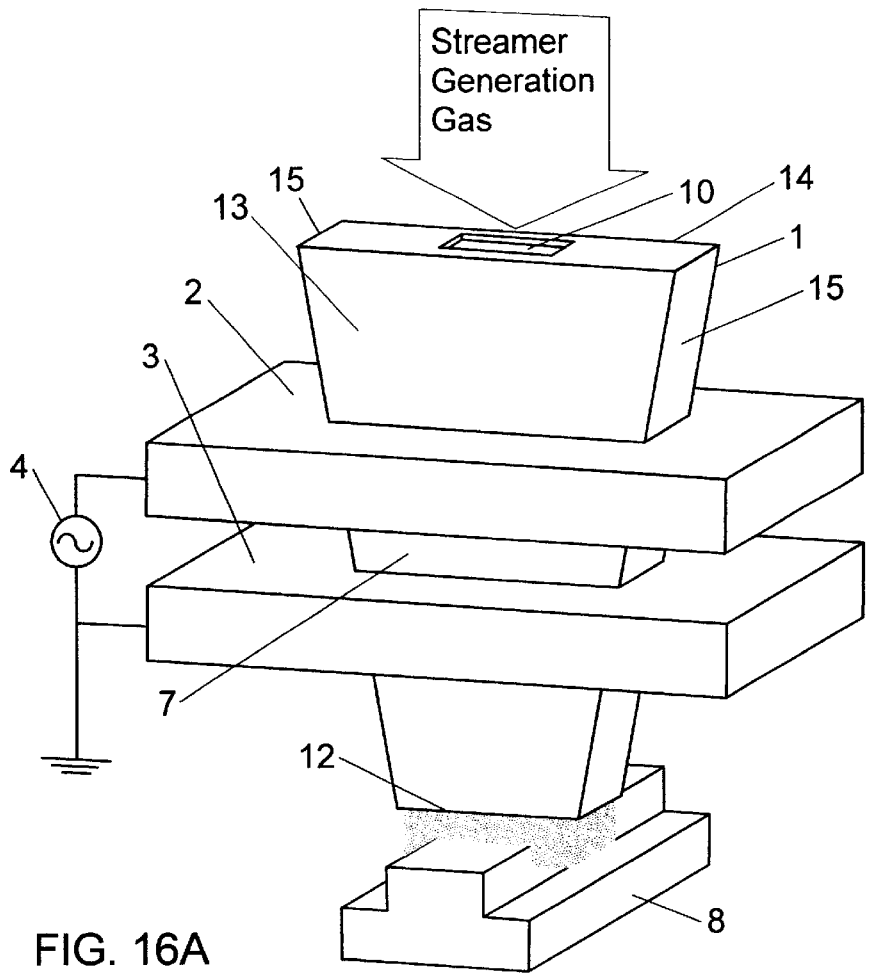
FIG. 16A is a schematic perspective view of a plasma treatment apparatus with another treatment-effect uniform means according to the present invention.

A preferred embodiment of this tubular vessel 1 is shown in FIG. 16A. In this case, the streamer generation gas radially flows downstream from the gas inlet 10, as shown by the arrows in FIG. 16B. The gas flow constituents flowing towards the plasma outlet 12 along the inner surfaces of the side walls 15 are focused under the influence of the angle of inclination of the side wall. It means that the flow velocity is the higher at the lateral opposite ends of the plasma outlet 12 than at the lateral center thereof. Therefore, when the plasma is injected from the plasma outlet 12 of this tubular vessel to a flat surface of the object 8, the time required for the plasma injected from the lateral opposite ends of the plasma outlet 12 to reach the flat surface of the object is shorter than the time required for the plasma injected from the lateral center thereof to reach the flat surface of the object. As a consequence, even when the plasma is injected to the flat surface of the object spaced from the plasma outlet 12 by an increased irradiation distance, or a surface to be treated of the object 8 has a convex shape, as shown in FIG. 16A, it is possible to uniformly perform the plasma treatment on those objects by use of this tubular vessel 1.

Figure 16B:
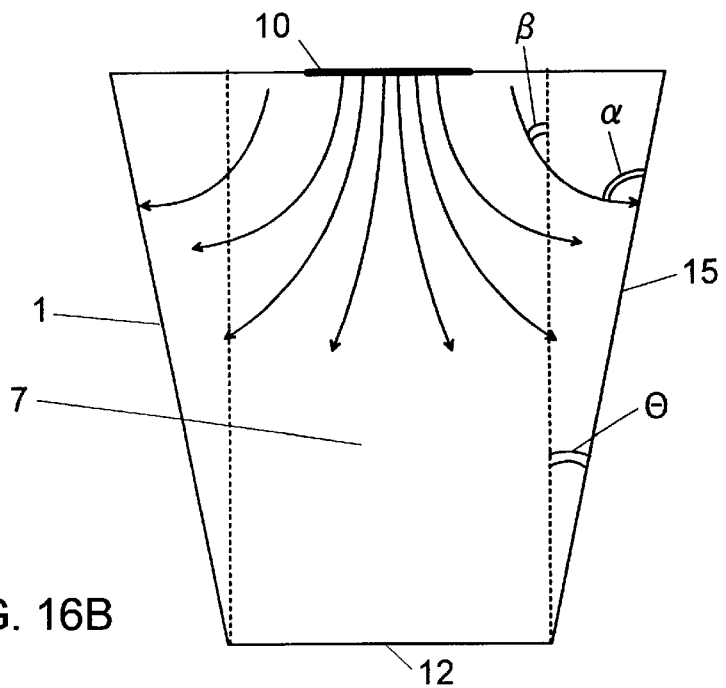
FIG. 16B is a diagram showing a flow of the plasma-generation gas in a tubular vessel of the apparatus.

The flow-velocity distribution of the plasma jet in the lateral direction of the laterally elongated cross section of the tubular vessel can be controlled by changing the angle θ of inclination of the side wall 15, as shown in FIG. 16B. As described above, to increase the flow velocity at the lateral opposite ends of the plasma outlet 12, it is preferred to set the angle θ within the range of 2 to 30 degrees. When the angle θ is less than 2 degrees, the effect of focusing the gas-flow constituents flowing along the inner surfaces of the side walls 15 may decrease, so that a sufficient flow velocity can not be obtained at the lateral opposite ends of the plasma outlet 12. On the other hand, when the angle θ is more than 30 degrees, the volume of the discharge space 7 increases. Therefore, it is necessary to increase the supply amount of the streamer generation gas. This will bring about an increase in running cost of the plasma treatment. From this viewpoint, it is preferred to use the angle θ of 30 degrees or less.

The tubular vessel 1 of this embodiment presents an additional advantage of preventing the occurrence of arc discharge between the plasma jet and the object 8. Therefore, when performing the plasma treatment to the object made of an electrically conductive material, it is particularly preferred to use this tubular vessel. The arc discharge easily develops when there is a surface discharge having high brightness in the tubular vessel. A mechanism for the surface discharge has not been sufficiently elucidated yet. In the case of using the tubular vessel 1 shown in FIG. 16A, the streamer generation gas radially diffuses from the gas inlet 10 into the tubular vessel 1. When a gas-flow constituent reaches the inner surface of the side wall 15, the gas-flow direction makes an angle $\alpha$ with the inner surface of the side wall (inclined wall). As easily understood from FIG. 16B, the angle $\alpha$ is larger than an angle $\beta$ defined between the gas-flow direction and a side wall (vertical wall) of the tubular vessel of a typical rectangular shape, as shown by the dotted lines in FIG. 14B. As a result, a velocity boundary layer appeared on a polar surface of the side wall 15 becomes thin, so that active species, particularly ions generated at the polar surface easily flow outside the velocity boundary layer. In addition, since the velocity boundary layer is thin, the side wall 15 is easily heat-exchanged by the gas-flow having a relatively high speed flowing outside the velocity boundary layer. Therefore, it is believed that the surface discharge is difficult to generate in the tubular vessel shown in FIG. 16A because of the reduction in ion density in the velocity boundary layer and the cooling of the side wall 15 by the heat exchange, and consequently the occurrence of arc discharge can be effectively prevented.

(g) As the tubular vessel 1 with the treatment-effect uniform means, it is preferred that a laterally elongated cross section of the tubular vessel has width, which is wider towards lateral opposite ends than at the center thereof, and a ratio of a center width ($S_{WS}$) and an end width ($S_{WE}$) is $0.8 \leq S_{WC}/S_{WE} < 1$.

Figure 17A:
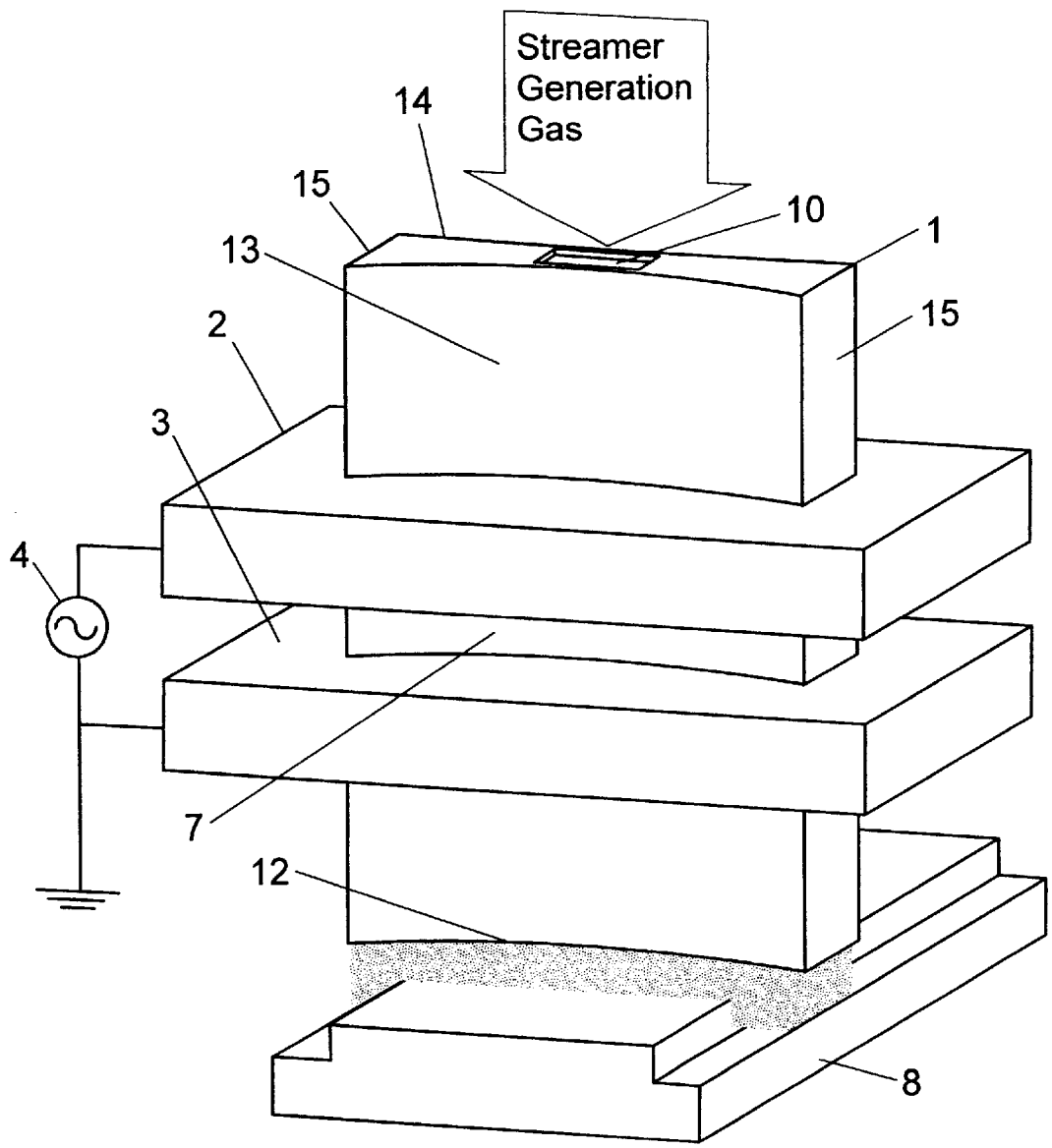
FIG. 17A is a schematic perspective view of a plasma treatment apparatus with another treatment-effect uniform means according to the present invention.
Figure 17B:
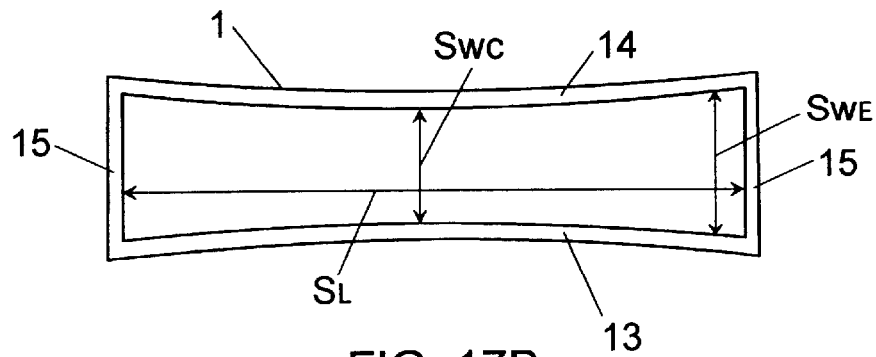
FIG. 17B is a cross-sectional view of a tubular vessel of the apparatus.

FIGS. 17A and 17B show a preferred embodiment of this tubular vessel. In this case, since the streamer generation gas easily flows into a region having small resistance to gas flow in the tubular vessel, the flow velocity is the higher at the lateral opposite ends of the plasma outlet 12 than at the lateral center thereof. Therefore, when the plasma is injected from the plasma outlet 12 of this tubular vessel to a flat surface of the object 8, the time required for the plasma injected from the lateral opposite ends of the plasma outlet 12 to reach the flat surface of the object is shorter than the time required for the plasma injected from the lateral center thereof to reach the flat surface of the object. As a consequence, even when the plasma is injected to the flat surface of the object spaced from the plasma outlet 12 by an increased irradiation distance, or a surface to be treated of the object 8 has a convex shape, as shown in FIG. 17A, it is possible to uniformly perform the plasma treatment on those objects by use of this tubular vessel 1.

Thus, the treatment-effect uniform means described above is effective to facilitate the uniformity of the plasma treatment effects on the object, and also available to another plasma treatment apparatus having the capability of treating the object with the plasma jet injected from a plasma generation chamber other than the plasma treatment apparatus of the present invention, regardless of kinds of plasma generating means and conditions.

By the way, when the turbulence generating member 6 explained above as the plasma uniform means is placed at an adequate position in the tubular vessel 1, it can also work as the treatment-effect uniform means. That is, when the turbulence generating member 6 is placed at a substantially center position between the opposite side walls 15 and between the gas inlet 10 and the discharge space 7 in the tubular vessel 1, as shown in FIG. 7, the flow velocity is the higher at the lateral opposite ends of the plasma outlet 12 than at the lateral center thereof. Therefore, the time required for the plasma injected from the lateral opposite ends of the plasma outlet 12 to reach a flat surface of the object is shorter than the time required for the plasma injected from the lateral center thereof to reach the flat surface of the object. As a result, even when a surface to be treated of the object 8 has a convex shape, as shown in FIG. 7, it is possible to uniformly perform the plasma treatment on those objects by use of this tubular vessel 1.

Figure 18:
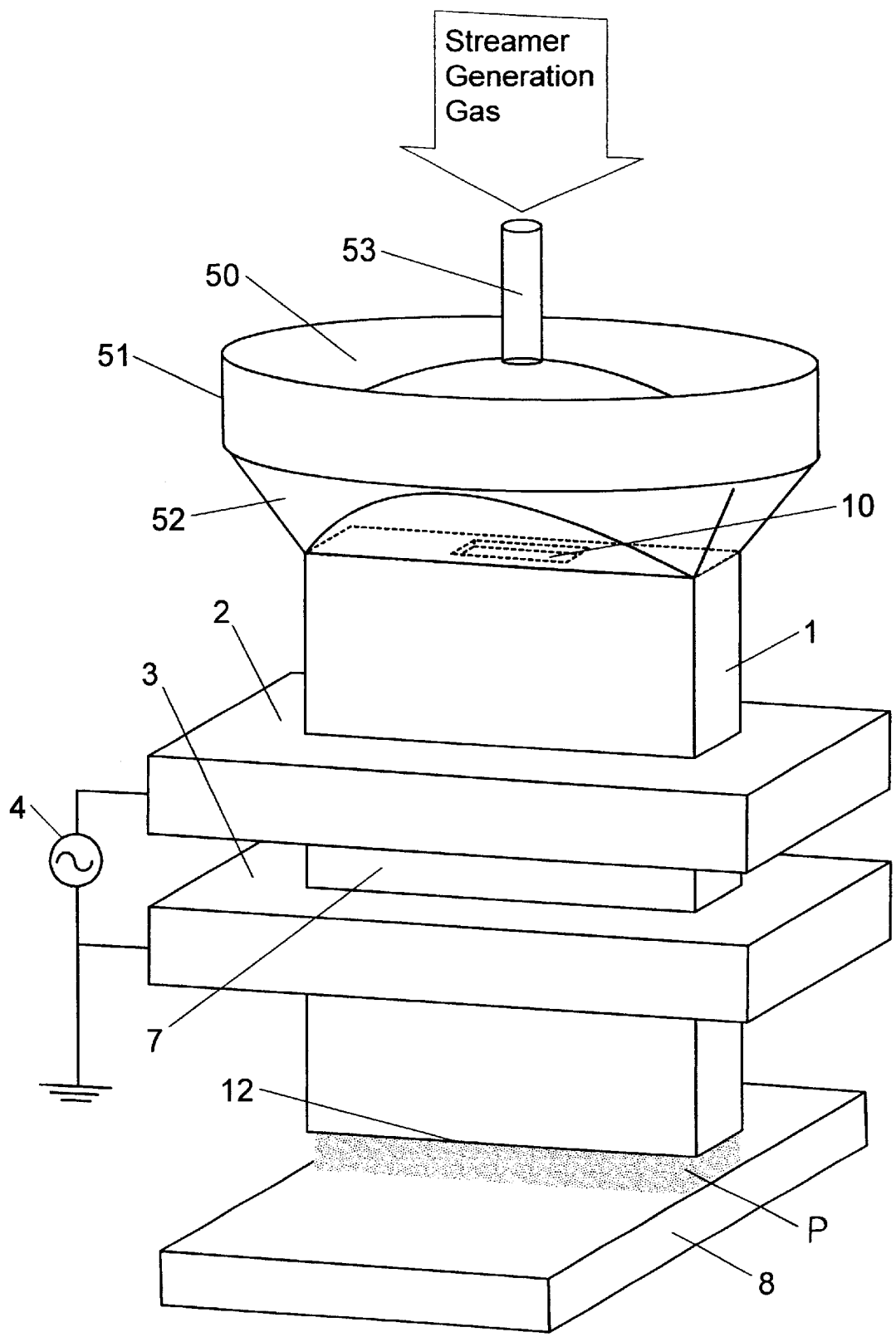
FIG. 18 is a schematic perspective view of a plasma treatment apparatus with a header according to the present invention.
Figure 19:
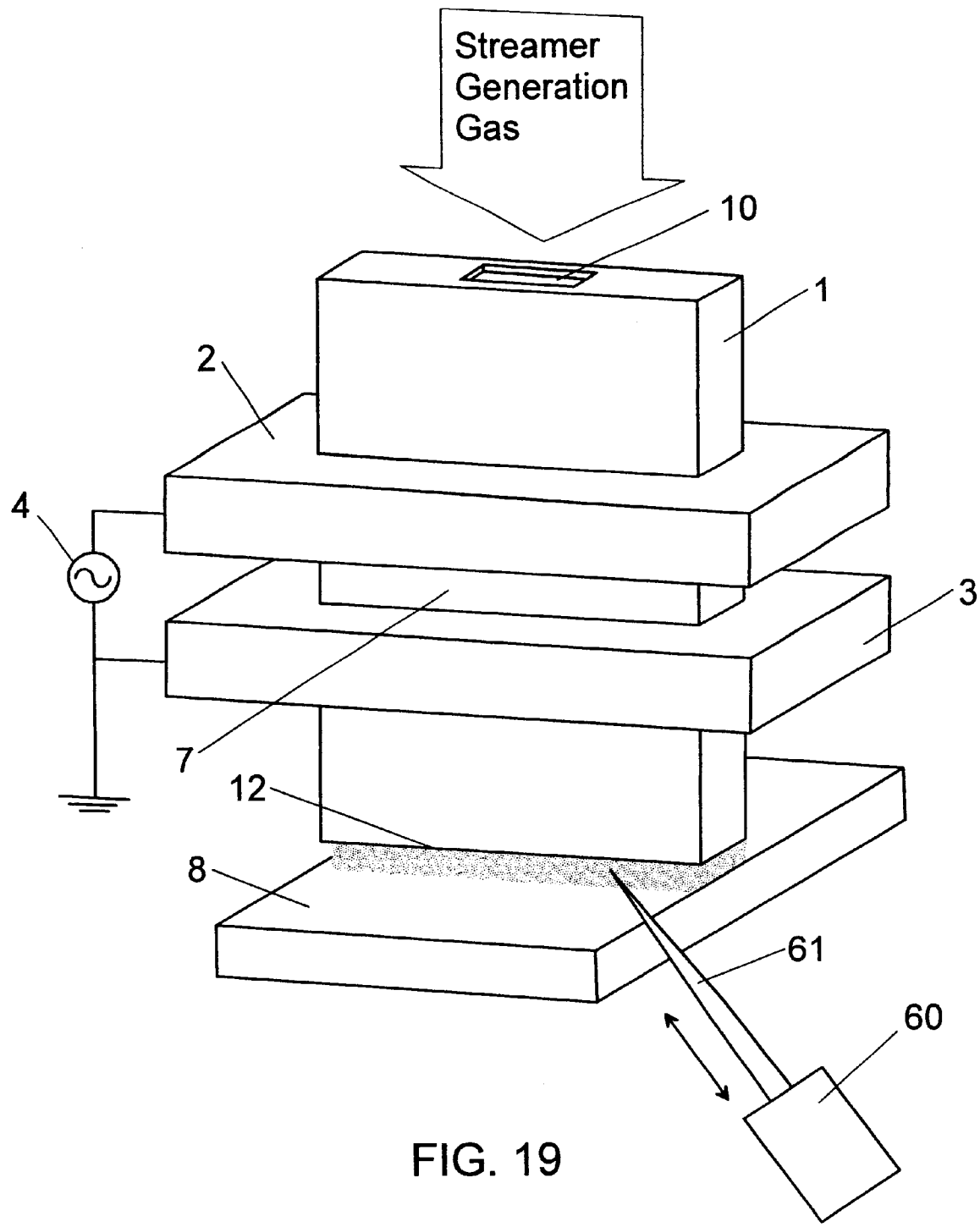
FIG. 19 is a schematic perspective view of a plasma treatment apparatus with a plasma ignition means according to the present invention.

It is preferred that the plasma treatment apparatus of the present invention comprises a header 50 detachably attached to a top end having the gas inlet 10 of the tubular vessel 1. That is, as shown in FIG. 18, the header 50 is mainly composed of a cylindrical portion 51 having a gas introduction pipe 53 at its top end and a focusing portion 52 for coupling between the cylindrical portion 51 and the gas inlet 10 and providing a focused gas flow into the tubular vessel 1 through the gas inlet 10. The header 50 may be integrally formed with the tubular vessel 1.

In the case of using the header 50, the streamer generation gas is supplied into the header through the gas introduction pipe 52, and then sent from the header into the tubular vessel through the gas inlet. In this case, since the flow of the streamer generation gas is rectified prior to the introduction of the streamer generation gas into the tubular vessel 1, it is effective to provide a stable flow of the streamer generation gas into the tubular vessel such that the flow velocity distribution of the streamer generation gas is symmetric with respect to the axial line of the tubular vessel. This brings about a further improvement for the uniformity of the plasma treatment effects.

The header 50 is not limited to the shape shown in FIG. 18. The header may be formed in such a structure that an undesired flow-velocity distribution of the streamer generation gas does not occur prior to the introduction thereof into the gas inlet 10, and a reduction in flow velocity of the streamer generation gas in the vicinity of the gas inlet can be prevented. If necessary, the header is available to each of the plasma treatment apparatuses explained above referring to the attached drawings.

It is also preferred that the plasma treatment apparatus of the present invention comprises a plasma ignition means for starting the generation of plural streamers in the tubular vessel. In a plasma treatment apparatus using plasma generated under atmospheric pressure or a pressure near the atmospheric pressure, it is needed to start the plasma by applying a relatively large voltage (about 1 kV or more) to the discharge space 7 through the electrodes. In addition, since a high frequency, e.g., 13.56 MHz is used as the frequency of the electric power applied to the discharge space, impedance matching between the power source 4 and the discharge space 7 (plasma generation region) is needed. Therefore, when a high voltage is applied to the electrode 2 to start the plasma treatment apparatus, arc discharge may be caused in a variable capacitor in an impedance matching device. In such a case, there is a possibility that the plasma treatment apparatus can not be started with quick response.

In the present invention, it is preferred to a high-voltage pulse generator 60 as the plasma ignition means, which is disposed in the vicinity of the plasma outlet 12. The generator 60 comprises a high-voltage pulse generating circuit built therein and an emitting electrode 61 for emitting a high-voltage pulse generated by the generating circuit. The emitting electrode 61 can be made of the same metal material as the electrodes 2, 3, and has a sharp-pointed end for enhancing the emission of the high-voltage pulse. In addition, it is preferred that the plasma ignition means comprises a traveling unit (not shown) for allowing the emitting electrode 61 to travel between a working position where the sharp-pointed end of the emitting electrode is positioned directly below (downstream) the plasma outlet 12 and a rest position where the emitting electrode is spaced from the working position. For example, an air cylinder can be used as the traveling unit.

To start the plasma, the emitting electrode 61 is traveled to the working position, and then the high-voltage pulse is emitted from the emitting electrode under conditions that the streamer generation gas is introduced into the tubular vessel and the AC voltage or the pulse voltage is applied to the discharge space 7. After the plasma is started, the emitting electrode 61 is removed from the working position to carry out the plasma treatment. A magnitude of the high-voltage pulse can be determined with reference to the kind of streamer generation gas. For example, it is preferred that the magnitude of the high-voltage pulse is three times or more of the magnitude of the voltage applied to the electrode 2 by use of the power source 4. A generation time of the high-voltage pulse can be optionally selected. Thus, by using the high-voltage pulse generator 60 as the plasma ignition means, it is possible to start the plasma with reliability and quick response, while preventing the arc discharge caused by applying the high voltage to the electrode 2.

Figure 20:
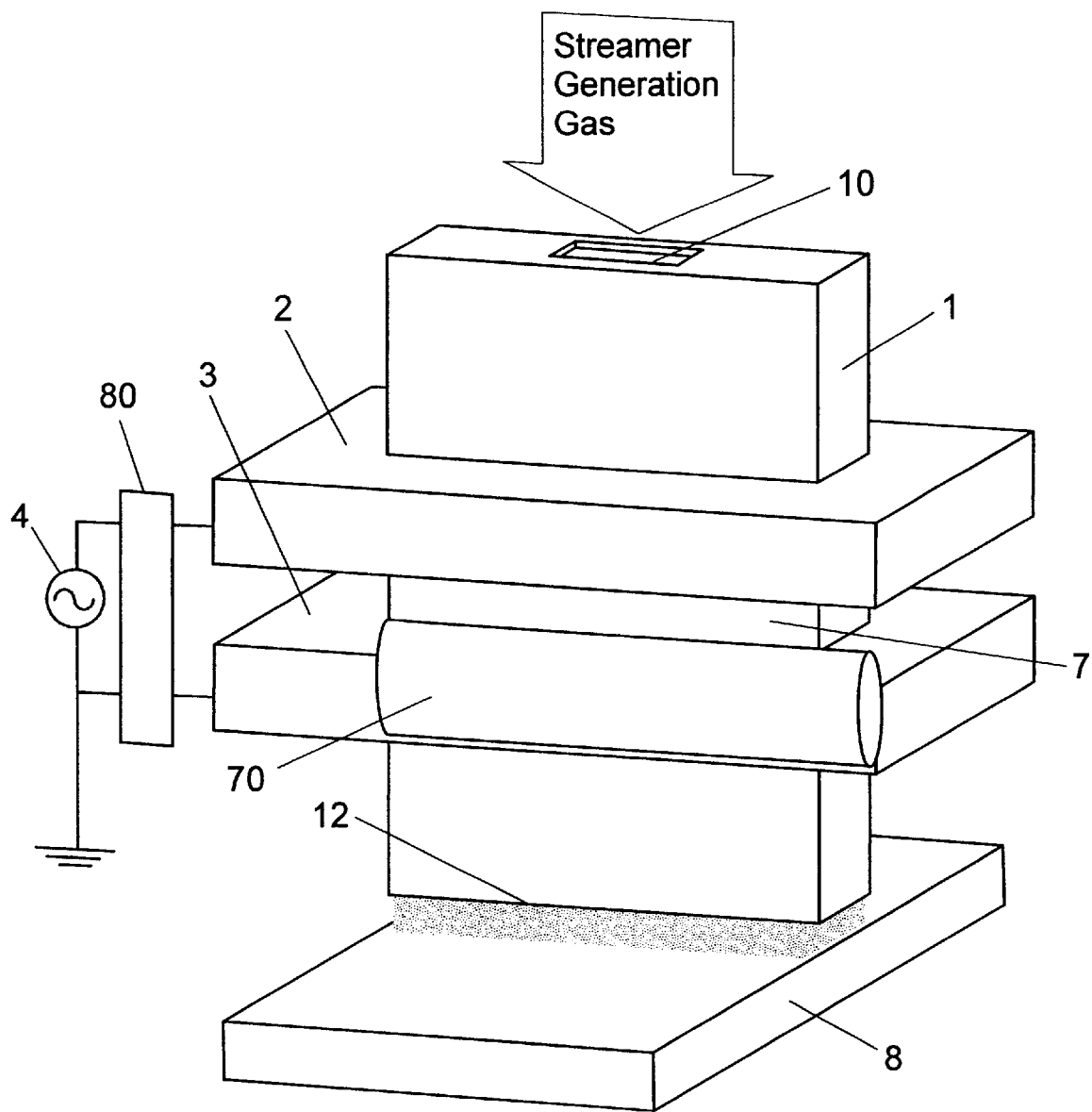
FIG. 20 is a schematic perspective view of a plasma treatment apparatus with another plasma ignition means according to the present invention.
Figure 21A:
FIGS. 21A to 21J are photographs showing a change in time of discharge state in a case of not making plural streamers generated in a tubular vessel uniform.
Figure 21F:
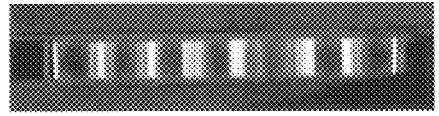
Figure 21B:
Figure 21G:
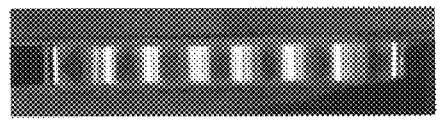
Figure 21C:
Figure 21H:
Figure 21D:
Figure 21I:
Figure 21E:
Figure 21J:
Figure 22A:
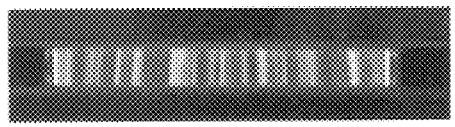
FIGS. 22A to 22J are photographs showing a change in time of discharge state in a case of making the plural streamers generated in the tubular vessel uniform (present invention)
Figure 22F:
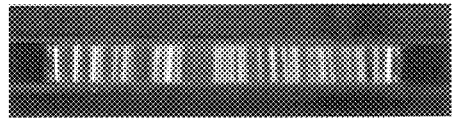
Figure 22B:
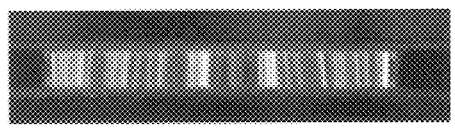
Figure 22G:
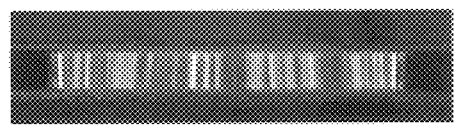
Figure 22C:
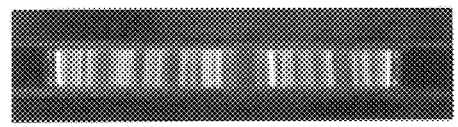
Figure 22H:
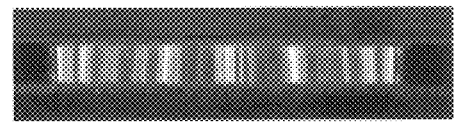
Figure 22D:
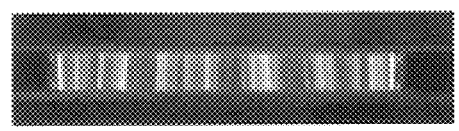
Figure 22I:
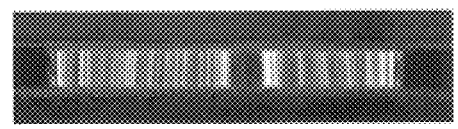
Figure 22E:
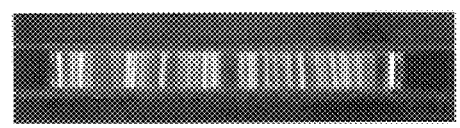
Figure 22J:
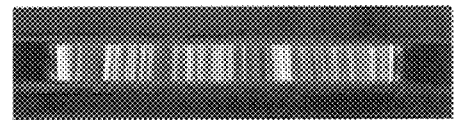

As shown in FIG. 20, it is also preferred to use a light source 70, e.g., UV lamps as the plasma ignition means. The light source 70 provides an energy light such as ultraviolet light having the capability of starting the plasma in the discharge space 7. In this embodiment, the light source 70 is formed in a cylindrical shape and disposed at a position adjacent to the electrode 2, 3 horizontally in the lateral direction of the elongated cross section of the tubular vessel 1 and, as shown in FIG. 20. Therefore, to thereby start the plasma, the energy light is irradiated to the discharge space 7 in the tubular vessel 1 through a clearance between the electrodes 2, 3 under conditions that the streamer generation gas is introduced into the tubular vessel and the AC voltage or the pulse voltage is applied to the discharge space 7.

Next, a plasma treatment method of the present invention is explained below in detail. It is needless to say that the above-described plasma treatment apparatus is preferably used to perform the plasma treatment method. However, the plasma treatment method does not necessarily require the use of the apparatus of the present invention. That is, when the plasma treatment apparatus at least has a tubular vessel in which a discharge space is defined, a pair of electrodes, gas supply unit for supplying the streamer generation gas, and a power source for applying a high-frequency voltage between the electrodes to generate plural streamers in the tubular vessel, it is possible to uniformly treat the object with plasma made up of the plural streamers with a high treatment speed according to the following method.

First, the streamer generation gas is supplied into the tubular vessel 1. As described above, the tubular vessel 1 is made of the electrically-insulating material and having the laterally elongated cross section, which has the gas inlet 10 at its one end and the plasma outlet 12 at the other end.

As the streamer generation gas, it is preferred to use a rare-gas containing gas. As the rare gas, it is possible to use argon, helium, neon, krypton or a mixture thereof. In particular, it is preferred to use argon or a mixture gas of argon and helium. Argon has an advantage that argon atoms can be more easily ionized as compared with helium atoms.

When using the streamer generation gas containing argon as the main component, it is effective to increase generation amounts of the streamers and improve the treatment speed. In addition, it is preferred to use argon as the main component from the viewpoint of cost performance of the plasma treatment method.

It is preferred that the argon content in the streamer generation gas is 30 vol % or more, and more preferably 50 vol % or more. When the argon content is 30 vol % or more, it is possible to achieve simultaneous generation of the plural streamers with reliability. The present invention does not ban the use of the streamer generation gas consisting of argon. However, it is not recommended because a probability of occurrence of the arc discharge increases. The arc discharge causes serious damages to the object. In such a case, it is recommended to use a mixture gas of argon and a small amount of another rare gas. In particular, it is preferred to use a mixture gas of argon and a small amount of helium. The use of this mixture gas is particularly effective to treat the object having electrical conductivity with the plasma. Concretely, it is preferred that the helium content in plasma-generation gas is 3 vol % or more. When the helium content is less than 3 vol %, the effect of preventing the arc discharge may not be sufficiently obtained. The occurrence of arc discharge can be prevented by increasing a distance between the object 8 and the tubular vessel 1, or lowering the electric power applied to the discharge space 7. However, these bring about a considerable reduction in the treatment speed. Therefore, the use of the plasma-generation gas containing 3 vol % or more of helium is useful to prevent the occurrence of arc discharge without lowering the treatment speed. From the viewpoint of the simultaneous generation of larger amounts of the streamers, it is preferred to set the upper limit of the helium content to 50 vol %.

In addition, as the streamer generation gas, a mixture gas of the rare gas and at least one reactive gas may be used with reference to the treatment purpose. For example, in the case of removing foreign substances such as organic substances from objects to be treated, stripping resist films, or performing surface modification to organic films, it is possible to use an oxidative gas such as oxygen, air, $CO_2$ and $N_2O$ as the reactive gas. To efficiently carry out the plasma treatment, it is preferred that a content of the oxidative gas in the streamer generation gas is 1 vol % or more by oxygen conversion. On the other hand, the upper limit of the oxidative-gas content is not limited. However, for example, it is possible to set the upper limit of the oxidative-gas content to 10 vol % from the viewpoint of the simultaneous generation of larger amounts of the streamers. That is, when the streamer generation gas excessively contain the oxidative gas such as oxygen, there is a possibility that the stability of plasma lowers and at worst the plasma disappears. That is because oxygen easily becomes negative ions such as $O^-$ and $O_2^-$, and a reaction of $O_2^- + Ar^+ \rightarrow O_2 + Ar$ happens.

On the other hand, in the case of reducing metal oxides contained in the object, it is possible to use a reduction gas such as hydrogen as the reactive gas. In this case, it is preferred that a content of the reduction gas in the streamer generation gas is 1 vol % or more to facilitate the reduction treatment. The upper limit of the reduction-gas content is not limited. However, for example, it is possible to set the upper limit of the reduction-gas content to 10 vol % for safety. In addition, even when using the streamer generation gas excessively containing the reduction gas, the reduction effects are saturated.

Next, the plural streamers of the streamer generation gas are generated under atmospheric pressure or a pressure near the atmospheric pressure, e.g., 93.3 to 106.7 KPa (=700 to 800 Torr), in the tubular vessel by applying the AC voltage or the pulse voltage between a pair of electrodes arranged such that electric flux lines develop substantially in the axial direction of the tubular vessel.

In the case of using the AC power source, it is preferred that a frequency of the AC voltage applied to the discharge space 7 is within a range of 1 kHz to 200 MHz. When the frequency is less than 1 kHz, the treatment efficiency gradually decreases due to a reduction in discharge stability. When the frequency is more than 200 MHz, the lifetime of the tubular vessel 1 or the electrodes 2, 3 may reduce due to an increase in plasma temperature. In addition, there is a possibility that the object receives thermal damages.

In the case of using a pulse power source, it is preferred that a frequency of the pulse voltage applied to the discharge space is within a range of 0.5 kHz to 200 MHz, and more preferably 1 kHz to 200 kHz. When the frequency is not within the above range, the same inconvenience described in case of using the AC power source may occur. In addition, it is preferred that a rise time of the pulse voltage is 100 μsec or less. When the rise time is more than 100 μsec, it may be difficult to obtain a sufficient plasma density in the discharge space. In this case, the efficiency of the plasma treatment lowers. The lower limit of the rise time is not particularly limited. Under the current circumstances, about 40 nsec (nanosecond) may be used as the lower limit of the rise time. If a rise time shorter than 40 nsec is realized, it is preferred to use the rise time shorter than 40 nsec. It is also preferred that a pulse electric field strength is within a range of 1 to 150 kV/cm.

In addition, it is preferred that an electric-power density (=applied electric power/volume of discharge space; W/cm$^3$) applied to the discharge space 7 is within a range of 20 to 3500 W/cm$^3$. As the electric-power density is less than 20 W/cm$^3$, it may be difficult to achieve the simultaneous generation of large amounts of the streamers. As the electric-power density is more than 3500 W/cm$^3$, the stability of discharge may lower.

Next, the plural streamers are made uniform in the lateral direction of the laterally elongated cross section of the tubular vessel to obtain plasma in the tubular vessel.

As a consequence of research and development eagerly conducted by the inventors of the present invention, it has been found that the plural streamers can be uniformly distributed in the lateral direction when the streamer generation gas is supplied into the tubular vessel such that a flow of the streamer generation gas in the tubular vessel has Reynolds number (Re) of 1700 or more under non-discharge condition. In this case, each of the streamers does not remain at its generation site for an extended time period. In other words, as explained later in detail, the generation site of each of the streamers changes in the lateral direction without cessation, so that the plasma made up of the plural streamers becomes uniform as whole.

Reynolds number (Re) represents a non-dimensional parameter indicative of fluid, which is expressed by the following equation (1):

$$Re = uD/v = \rho uD/\mu$$

wherein "$\rho$" is a density of the streamer generation gas;
"u" is an average speed of the streamer generation gas at an upper end portion of the discharge space under non discharge condition, which is given by dividing a gas flow amount "Q" supplied into the discharge space by a cross-sectional area "S" at the upper-end portion of the discharge space;

"D" is an upper-end width of the discharge space;
"v" is a coefficient of kinematic viscosity of the streamer generation gas; and "$\mu$" is a coefficient of viscosity of the streamer generation gas.

Therefore, under a constant the slit width of the tubular vessel, Reynolds number increases as the average speed "u" increases, or the coefficient of kinematic viscosity "v" decreases. When the Reynolds number (Re) is 1700 or more, large amounts of the turbulence constituents of the streamer generation gas are generated in the tubular vessel to improve the distribution uniformity of the streamers.

To obtain the Reynolds number of 1700 or more, for example, it is preferred to supply the streamer generation gas into the tubular vessel such that a flow velocity of the streamer generation gas in the axial direction of the tubular vessel is 5 m/sec. or more. In this case, even when the argon content in the streamer generation gas is high, i.e., the coefficient of kinematic viscosity is a large value, the turbulence constituents can be easily generated The upper limit of the flow velocity is not limited. However, for example, it is possible to set the upper limit of the flow velocity to 40 m/sec from the viewpoint of the stability of the plasma generated.

To foster better understanding of the present invention, it is useful to discuss comparisons of the presence or absence of the plasma uniform step of making the plural streamers uniform in the lateral direction. FIGS. 21A to 21J are photographs of the plural streamers generated in the tubular vessel without the plasma uniform step, which were successively taken every 1/30 seconds from the clearance between the electrodes 2, 3.

In this case, streamer generating regions having high brightness are clearly distinguished from streamer non-generating regions, each of which is a dark region between adjacent streamer generating regions. The plural streamers are not made uniform in the lateral direction (horizontal direction in FIGS. 21A to 21J). In addition, the nonuniform distribution of the streamers does not change virtually with time, as shown in these photographs. It is believed that this is because of the following reason. That is, when the streamers are generated in parallel with the electric flux lines in the tubular vessel made of the dielectric material, a surface temperature of the dielectric material (the inner surface of the tubular vessel) facing the streamers increases, so that secondary electrons are easily emitted from the dielectric material. Therefore, the growth of the respective streamer is enhanced by the help of the emitted secondary electrons. At this time, when the streamer generation gas flows in only a direction substantially parallel to the electric flux lines without the presence of the gas-flow constituents in different directions, an electron avalanche happens only in the vicinity of the already-generated streamer. Therefore, the distribution of the generation sites of the streamers and the non-generation sites thereof is stably maintained with time, and each of the streamers stands still at the generation site.

When using plasma made up of the plural streamers having the nonuniform distribution thereof for the plasma surface treatment, surface regions of the object placed directly below the streamer generation sites are treated with a high treatment speed. However, the treatment effects are virtually obtained on surface regions of the object placed directly below the streamer non-generation sites. As a consequence, considerable variations in treatment effects in the lateral direction of the tubular vessel occur. Such a treatment does not reach a state of practicability.

On the other hand, FIGS. 22A to 22J are photographs of the plural streamers generated in the tubular vessel by carrying out the plasma uniform step, which were successively taken every 1/30 seconds at the same camera angle as the above. As shown in these photographs, the generation amounts of streamers are increased, so that a difference between the streamer generation site and the streamer non-generation site becomes very small. As compared with the above case, the distribution uniformity of the plural streamers in the lateral direction (horizontal direction in FIGS. 22A to 22J) is remarkably improved. In other words, by carrying out the plasma uniform step of the present invention and/or using the plasma treatment apparatus having the plasma uniform means of the present invention, the generation and extinction of the streamers can be induced in the discharge space by an extremely short time scale, so that the distribution of plural streamers in the lateral direction is made uniform as whole. For example, the generation and extinction of 6 or 7 streamers are repeated by a time scale between several hundreds $\mu$sec and several msec. Since positions of bright lines of the streamers successively vary with time, the streamers are a spatially uniform, stable discharge in the long time scale.

In addition, a mechanism for making the streamers uniform in the lateral is discussed. As described above, when the turbulence constituents of the streamer generation gas generated in the tubular vessel overlap with at least a part of the discharge space, it is possible to obtain the effect of making the streamers uniform in the lateral direction. When the turbulence constituents reach the discharge space, the gas-flow constituents having random directions other than the direction substantially parallel to the electric flux lines appear in the discharge space. By help of those gas-flow constituents, generated active species, particularly ions can freely move n the discharge space. As a consequence, the electron avalanche randomly happens in the discharge space. Therefore, strictly speaking, the distribution of the streamer generation sites in the lateral direction changes with cessation, and most of the streamers do not stand at the same generation sites for an extended time period. This brings about the uniformity of plasma in the lateral direction as whole.

When using plasma made up of the plural streamers having the uniform distribution thereof for the plasma surface treatment, a surface region of the object placed directly below the plasma are uniformly treated with a higher treatment speed as compared with the case of using glow discharge. Thus, since variations in treatment effects in the lateral direction are much reduced, while the high treatment speed being maintained, the plasma treatment apparatus and method the present invention reach a state of practicability.

Next, the object is treated with the plasma having a curtain-like shape provided from the plasma outlet of the tubular vessel.

In this step, it is preferred that the object is horizontally moved in a transferring direction perpendicular to the lateral direction of the elongated cross section of the tubular vessel, while the plasma being injected to the object from the plasma outlet. Alternatively, the tubular vessel may be moved horizontally, while injecting the plasma. In addition, when a reciprocating motion of the object or the plasma treatment apparatus in a direction perpendicular to the transferring direction is provided, the injection of the plasma to the object is repeated, so that the uniformity of the plasma surface treatment can be further facilitated. Moreover, when the object has a size larger than the length (L) of the tubular vessel, it is preferred to move the object such that the plasma is uniformly injected to the entire surface of the object with use of an object traveling means such as robots. Additionally, when moving the object or the plasma treatment apparatus in the lateral direction of the tubular vessel, it is possible to selectively treat a straight-line region on the object. In this case, since the plasma irradiation time increases, the treatment effects will be significantly improved.

EXAMPLES

The followings are preferred examples of the present invention. In Examples 1 to 18 and Comparative Example 1, a silicon wafer having a negative-type resist film of 1-$\mu$m thickness thereon was used as an object. In addition, plasma treatments were successively performed by transferring the object in a horizontal direction at the speed of 10 mm/sec under the condition that a distance between the plasma outlet and the object is 5 mm. As evaluations, discharge state was observed during the plasma treatment. In addition, after the plasma treatment, a measurement of etching depth of the resist film was carried out to calculate the mean value of etching depth.

Examples 1 and Comparative Example 1

In Example 1, the plasma treatment apparatus of FIG. 1 having the header 50 shown in FIG. 18 was used. The tubular vessel 1 is of a rectangular shape and made of quartz glass of 1 mm thickness. Slit width, slit length and height of the tubular vessel 1 are 1 mm, 40 mm, and 80 mm, respectively. A distance between the pair of electrodes 2, 3 is 5 mm. Each of the electrodes 2, 3 is made of copper, and has gold-plating layers on its outer surface. In addition, the electrode 2, 3 has a hollow structure, in which a channel for cooling water is formed. Therefore, the cooling water was circulated through the channel during the plasma treatment to prevent an excessive increase in temperature of the discharge space 7. The electrode 2 is connected to the power source 4. The electrode 3 is grounded.

Figure 23:
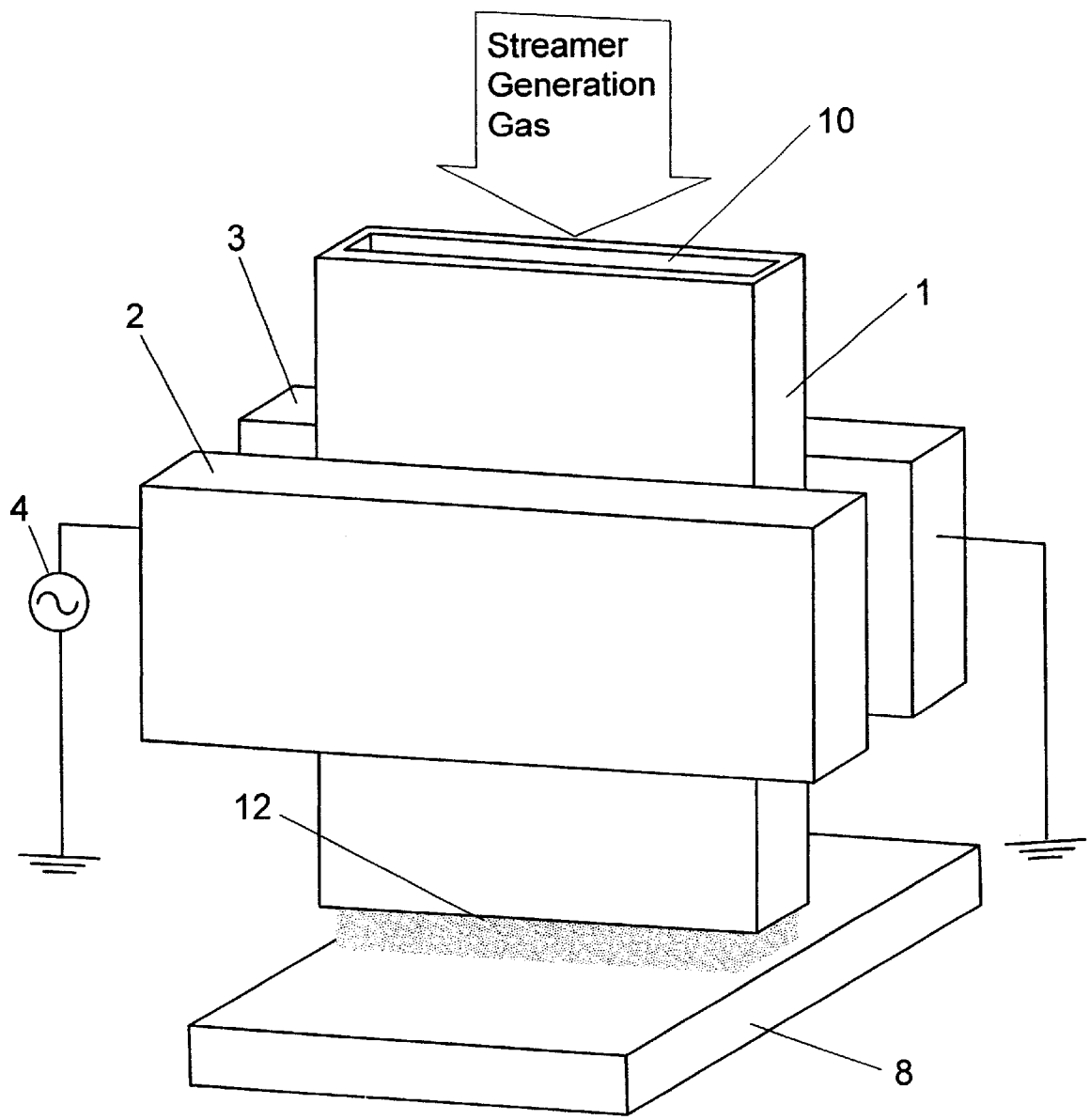
FIG. 23 is a schematic perspective view of a plasma treatment apparatus (prior art) used to generate glow discharge in Comparative Example 1.

In Comparative Example 1, a conventional plasma treatment apparatus using glow discharge was used. That is, as shown in FIG. 23, the apparatus is substantially the same as the apparatus shown in FIG. 1 other than that a pair electrodes 2, 3 are arranged such that the tubular vessel 1 is sandwiched between the electrodes.

Plasma made up of plural streamers was generated by supplying a mixture gas of 12 liter/min of helium and 0.4 liter/min of oxygen as the streamer generation gas into the tubular vessel under atmospheric pressure, and applying an AC voltage (frequency: 13.56 MHz, applied electric power: 1000 W) to the discharge space 7. The object was treated with the plasma having a curtain-like shape injected from the plasma outlet 12. In Example 1, to make the streamers uniform, the streamer generation gas was supplied into the tubular vessel 1 such that a flow velocity of the streamer generation gas in the axial direction of the tubular vessel is 5 m/sec or more (calculated value: 5.17 m/sec), and the tubular vessel 1 having the slit width of 1 mm was used as the plasma uniform means.

As shown in the Table.1, when performing the plasma treatment of Example 1, plural streamers were uniformly generated in the lateral direction of the laterally elongated cross section of the tubular vessel in the discharge space. In Comparative Example, glow discharge was generated in the tubular vessel. In addition, the mean value of etching depth of Example 1 is much larger than that of Comparative Example 1. This means that the plasma treatment using the streamers of Example 1 can efficiently treat the object with the high treatment speed as compared with the plasma treatment using the glow discharge.

TABLE 1

| | Mean value of etching depth (Å) | Discharge state |
|---|---|---|
| Example 1 | 100 | The plasma was a mixture of plural streamers and glow discharge. |
| Comparative Example 1 | 35 | Only glow discharge was generated. |

Examples 2 to 5

A plasma treatment apparatus used in these Examples is substantially same as the apparatus used in Example 1 other than that the slit width, slit length and height of the tubular vessel 1 is 1 mm, 56 mm, and 80 mm, respectively, and the aperture width and length of the gas inlet 10 of the tubular vessel are 1 mm and 16 mm, respectively, as shown in FIG. 3.

Plasma made up of plural streamers was generated by supplying a mixture gas of 12 liter/min of a rare gas and 0.4 liter/min of oxygen as the streamer generation gas into the tubular vessel under atmospheric pressure, and applying an AC voltage (frequency: 13.56 MHz, applied electric power: 700 W) to the discharge space 7. As the rare gas, only argon was used in Example 2, and mixtures of argon and helium having different compositions were used in Examples 3 to 5, as shown in Table 2. The object 8 was treated with the plasma having a curtain-like shape injected from the plasma outlet 12. In these Examples, to make the streamers uniform, the tubular vessel having the slit width of 1 mm and the gas inlet 10, which has an aperture area (16 mm²) smaller than the cross-sectional area (56 mm²) immediately below the gas inlet of the tubular vessel, was used as the plasma uniform means.

As shown in Table 2, as the argon content in the streamer generation gas increases, there was a tendency that the treatment speed increases. This is because the generation amounts of the streamers increase in proportion to the argon content. Thus, there is a direct correlation between the generation amounts of the streamers and the etching treatment effects. In addition, as the argon content increases, the uniformity of etching treatment was improved.

TABLE 2

| | Ar/(Ar + He) (vol %) | Mean value of etching depth (Å) | Discharge state (1) Streamer generation amounts (2) Uniformity of Plasma |
|---|---|---|---|
| Example 2 | 100 | 700 | (1) Large (2) Good |
| Example 3 | 90 | 600 | (1) Large (2) Good |
| Example 4 | 50 | 380 | (1) Medium (2) Good |
| Example 5 | 10 | 50 | (1) Small (2) Good |

Examples 6 to 8

A plasma treatment apparatus used in these Examples is substantially the same as the apparatus used in Example 1 other than the following features. That is, the slit width, slit length and the height of the tubular vessel 1 is 1 mm, 56 mm, and 80 mm, respectively. The aperture width and length of the gas inlet 10 of the tubular vessel are 1 mm and 16 mm, respectively, as shown in FIG. 3. In each of the Examples, the distance (D) between the electrodes 2, 3 is determined, as shown in Table 3.

Plasma made up of plural streamers was generated by supplying a mixture gas of 2 liter/min of helium, 10 liter/min of argon, and 0.4 liter/min of oxygen as the streamer generation gas into the tubular vessel under atmospheric pressure, and applying an AC voltage (frequency: 13.56 MHz, applied electric power: 600 W) to the discharge space 7. The object 8 was treated with the plasma having a curtain-like shape injected from the plasma outlet 12. In these Examples, to make the streamers uniform, and the tubular vessel 1 having the slit width of 1 mm and an aperture area (16 mm²) smaller than the cross-sectional area (56 mm²) immediately below the gas inlet of the tubular vessel, was used as the plasma uniform means.

As understood from Table 3, in Example 6 (d=5 mm), large amounts of streamers were uniformly generated in the lateral direction in the discharge space 7. In addition, variations in etching depth were remarkably reduced. Therefore, it was confirmed that the etching treatment can be performed with a high degree of reliability. In Example 7 (d=1 mm), spark discharge often occurred outside of the tubular vessel and between the electrodes 2, 3 at the time of starting the generation of streamers. On the other hand, in Example 8 (d=20 mm), there was a case that the streamers are difficult to generate.

TABLE 3

| | Distance between Electrodes | Mean value of etching depth (Å) | Discharge State |
|---|---|---|---|
| Example 6 | 5 mm | 450 | Streamer generation amounts: Large Uniformity of Plasma: Good |
| Example 7 | 1 mm | — | The plasma is a mixture of plural streamers and glow discharge. Uniformity of Plasma: Good |
| Example 8 | 20 mm | — | Stability of discharge: Low |

Examples 9 to 11

A plasma treatment apparatus used in these Examples is substantially same as the apparatus used in Example 1 other than that the slit width, slit length and the height of the tubular vessel 1 is 1 mm, 56 mm, and 80 mm, respectively.

Plasma made up of plural streamers was generated by supplying a mixture gas of helium, argon, and oxygen as the streamer generation gas into the tubular vessel under atmospheric pressure, and applying an AC voltage (frequency: 13.56 MHz, applied electric power: 700 W) to the discharge space 7. The supply amounts of helium, argon, and oxygen in each of Examples 9 to 11 are shown in Table 4. The object 8 was treated with the plasma having a curtain-like shape injected from the plasma outlet 12. In these Examples, to make the streamers uniform, the streamer generation gas is supplied into the tubular vessel such that a flow of the streamer generation gas in the tubular vessel has Reynolds number of 1700 or more under non-discharge condition (Examples 10 and 11), and the tubular vessel 1 having the slit width of 1 mm (Examples 9 to 11) was used as the plasma uniform means.

With respect to Examples 9 to 11, in addition to the mean value of etching depth, a range (%) of variation in etching depth was determined by calculating a difference between the maximum and minimum etching depths, and dividing the difference by the mean value of etching depth. Moreover, the Reynolds number (Re) is calculated by the equation (1). These results are shown in Table. 4.

Table 4 shows that the range of variation in etching depth becomes narrower as the Reynolds number increases. In addition, there is a tendency that the etching speed increases in proportion to the total flow amount of the plasma-generation gas. The discharge state of the plasma of Example 11, which has the large Reynolds number of more than 1700 obtained by controlling the flow amount and the composition of the streamer generation gas, shows that larger amounts of the streamers are uniformly generated in the lateral direction of the tubular vessel, as shown in FIGS. 22A to 22J. On the other hand, in Example 9, though the uniformity of plasma was relatively good, the generation amounts of the streamers reduced. It is thought that a considerable decrease in etching depth is caused by the reduction in the generation amounts of the streamers.

sufficient flow velocity of the streamer generation gas could not be achieved at the gas inlet of the tubular vessel by the gas supply amounts of this Example. As a consequence, since vortex flows of the gas were not sufficiently supplied downstream, the generation amounts of streamers decreased as compared with the cases of Examples 15 and 16. In addition, a reduction in the electric-power density (=applied electric power/unit volume of discharge space; $W/cm^3$) resulted in a decrease in the mean value of etching depth.

TABLE 4

| | He flow amount (SLM) | Ar flow amount (SLM) | $O_2$ flow amount (SCCM) | Reynolds number | Mean value of etching depth (Å) | Variations (%) | Discharge state: (1) Streamer generation amount (2) Uniformity of plasma |
|---|---|---|---|---|---|---|---|
| Example 9 | 2.5 | 0.5 | 100 | 1000 | 40 | 48 | (1) Small (2) Good |
| Example 10 | 0.5 | 2.5 | 100 | 3100 | 150 | 26 | (1) Large (2) Good |
| Example 11 | 2.0 | 10.0 | 400 | 12500 | 520 | 15 | (1) Very large (2) Very Good |

Examples 12 to 14

A plasma treatment apparatus used in these Examples is substantially same as the apparatus used in Example 1 other than that the slit width, slit length and height of the tubular vessel 1 are a value listed in Table 5, 30 mm, and 80 mm, respectively, and the aperture width and length of the gas inlet 10 of the tubular vessel are the same value of the slit width and 8.5 mm, respectively.

Plasma made up of plural streamers was generated by supplying a mixture gas of 1 liter/min of helium, 5 liter/min of argon, and 0.2 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12. In these Examples, to make the streamers uniform, the tubular vessel 1 having the slit width of 1 mm (Example 13) and the gas inlet 10, which has an aperture area (Example 12: 4.25 $mm^2$, Example 13: 8.5 $mm^2$, Example 14: 59.5 $mm^2$) smaller than the cross-sectional area (Example 12: 15 $mm^2$, Example 13: 30 $mm^2$, Example 14: 210 $mm^2$) immediately below the gas inlet of the tubular vessel, was used as the plasma uniform means.

After the plasma treatment, the mean value of etching depth and a range (%) of variation in etching depth were determined. The range of variation was obtained by calculating a difference between the maximum and minimum etching depths, and dividing the difference by the mean value of etching depth. These results are shown in Table. 5.

TABLE 5

| | Slit width | Mean value of etching depth (Å) | Variation (%) | Discharge state: (1) Streamer generation amount (2) Uniformity of plasma |
|---|---|---|---|---|
| Example 12 | 0.5 mm | 210 | 15 | (1) Extremely Large (2) Extremely Good |
| Example 13 | 1 mm | 550 | 16 | (1) Very large (2) Very Good |
| Example 14 | 7 mm | 20 | 35 | (1) Large (2) Good |

*1: Extremely Large > Very Large > Large
*2: Extremely Good > Very Good > Good

As shown in Table 5, in Example 12, the uniformity of treatment was extremely good, but the mean value of the etching depth is a half of the value of Example 13. On the other hand, in Example 14, due to the large slit width, a

Examples 15 to 17

A plasma treatment apparatus used in these Examples is substantially same as the apparatus used in Example 1 other than that the slit width, slit length and height of the tubular vessel 1 are 1 mm, 56 mm, and 80 mm, respectively, and the aperture length of the gas inlet 10 is a value listed in Table 6.

Plasma made up of plural streamers was generated by supplying a mixture gas of 3.39 liter/min of helium, 0.48 liter/min of argon, and 0.43 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12.

With respect to Examples In these Examples, to make the streamers uniform, the streamer generation gas is supplied into the tubular vessel such that a flow of the streamer generation gas in the tubular vessel has Reynolds number of 1700 or more under non-discharge condition (Examples 16 and 17), and the tubular vessel 1 having the slit width of 1 mm (Examples 15 to 17) and the gas inlet 10, which has an aperture area (Example 16: 16 $mm^2$, Example 17: 8 $mm^2$) smaller than the cross-sectional area (56 $mm^2$) immediately below the gas inlet of the tubular vessel, was used as the plasma uniform means.

After the plasma treatment, the mean value of etching depth and a range (%) of variation in etching depth were determined. The range of variation was obtained by calculating a difference between the maximum and minimum etching depths, and dividing the difference by the mean value of etching depth. These results are shown in Table. 6.

TABLE 6

| | Aperture width of gas inlet | Mean value of etching depth (Å) | Variations (%) | Discharge state: (1) Streamer generation amount (2) Uniformity of plasma |
|---|---|---|---|---|
| Example 15 | 56 mm | 90 | 48 | (1) Small (2) Lower than Example 17 |
| Example 16 | 16 mm | 100 | 21 | (1) Very large (2) Very Good |
| Example 17 | 8 mm | 95 | 38 | (1) Very large (2) Lower than Example 16 |

As shown in Table 6, the plasma treatment of Examples 15 resulted in larger variations in etching depth than the plasma treatment of Example 17. In Example 15, the aperture area (56 mm²) of the gas inlet 10 is the same as the area of the plasma outlet 12. Under the conditions of the gas flow amount and the gas composition of this Example, the Reynolds number is 1093, which is less than 1700 that is the Reynolds number required to provide sufficient amounts of the turbulence constituents. On the other hand, the plasma treatment of Examples 17 resulted in larger variations in etching depth than the plasma treatment of Example 16. In this case, since the aperture area of the gas inlet 10 is smaller than the aperture area of Example 16, the flow velocity of the streamer generation gas supplied into the center of the discharge space became too fast. As a consequence, the stability of discharge state in the center of the discharge space lowered.

Examples 18

In Example 18, the plasma treatment apparatus of FIG. 7 having the header 50 shown in FIG. 18 was used. The tubular vessel 1 is of a rectangular shape and made of quartz glass of 1 mm thickness. Slit width, slit length and height of the tubular vessel 1 are 1 mm, 56 mm, and 80 mm, respectively. A distance between the pair of electrodes 2, 3 is 5 mm. In this Example, a turbulence generating member 6 having a shape of triangular prism is used as the plasma uniform means. The base plane of the triangular prism is of an isosceles triangle having dimensions of 20 mm (base) and 15 mm (height). The turbulence generating member 6 was disposed directly below the gas inlet in the tubular vessel 1 such that a distance between the gas inlet and a vertex of the turbulence generating member 6 is 5 mm and the base planes of the turbulence generating member 6 extend parallel to the front and rear walls 13, 14 of the tubular vessel. The other components of this plasma treatment apparatus are substantially the same as the apparatus of Example 1.

Plasma made up of plural streamers was generated by supplying a mixture gas of 3.39 liter/min of helium, 0.48 liter/min of argon, and 0.43 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12. In these Examples, the tubular vessel 1 having the slit width of 1 mm and the turbulence generating member 6 was used as the plasma uniform means.

After the plasma treatment, the mean value of etching depth and a range (%) of Variation in etching depth were determined. The range of variation was obtained by calculating a difference between the maximum and minimum etching depths, and dividing the difference by the mean value of etching depth. Results are shown in Table. 6, with the results of Example 15.

TABLE 7

| | Mean value of etching depth (Å) | Variations (%) | Discharge state: (1) Streamer generation amount (2) Uniformity of plasma |
|---|---|---|---|
| Example 18 | 110 | 16 | (1) Very large (2) Very Good |
| Example 15 | 90 | 48 | (1) Small (2) Much lower than Example 18 |

As shown in Table 7, when using the plasma treatment apparatus having the turbulence generating member, large amounts of streamers were generated in the tubular vessel and the generated streamers were uniformly distributed in the lateral direction of the tubular vessel. Therefore, the surface treatment of Example 18 resulted in smaller variations in etching depth than the surface treatment of Example 15, in which the Reynolds number is 1093.

Examples 19 to 25

In Example 19, a plasma treatment apparatus of FIG. 3 was used, which is substantially same as the apparatus used in Example 1 other than that the slit width, slit length and height of the tubular vessel 1 are 1 mm, 56 mm, and 80 mm, respectively, and the aperture width and length of the gas inlet 10 of the tubular vessel are 1 mm and 16 mm, respectively.

In Example 20, a plasma treatment apparatus of FIG. 17A was used, which is substantially same as the apparatus used in Example 1 other than the following features. The slit length and height of the tubular vessel 1 are 56 mm and 80 mm, respectively. This apparatus has the treatment-effect uniform means (g). That is, the tubular vessel is formed with a pair of front and rear walls 13, 14 having a curved surface and a pair of side walls 15 having a flat surface such that a laterally elongated cross section thereof has width, which is wider towards lateral opposite ends than at the center thereof. A center width of the cross section of the tubular vessel is 1 mm. A difference between the center width ($S_{WC}$) and an end width ($S_{WE}$) of the cross section is 45 µm. The aperture width and length of the gas inlet 10 of the tubular vessel are 1 mm and 16 mm, respectively.

In Example 21, a plasma treatment apparatus used of FIG. 16 was used, which is substantially same as the apparatus used in Example 1 other than the following features. The slit width, first slit length at the side of the gas inlet 10, second slit length at the side of the plasma outlet 12, and height of the tubular vessel 1 are 1 mm, 85 mm, 56 mm and 80 mm, respectively. This apparatus has the treatment-effect uniform means (f). That is, the tubular vessel is formed with a pair of front and rear walls 13, 14 of an isosceles-trapezoid shape and a pair of side walls 15 of a rectangular shape, such that a cross-sectional area perpendicular to the axial direction of the tubular vessel gradually decreases towards the plasma outlet 12. An angle θ defined between the axial direction of the tubular vessel and the side wall 15 is 10.3 degrees. The aperture width and length of the gas inlet 10 of the tubular vessel are 1 mm and 24 mm, respectively.

In Example 22, a plasma treatment apparatus used of FIG. 11 was used, which is substantially same as the apparatus used in Example 1 other than the following features. The slit width, slit length, and the height of the tubular vessel 1 are 1 mm, 56 mm and 80 mm, respectively. This apparatus has the treatment-effect uniform means (b). That is, the tubular vessel has two gas inlets 10 each having the aperture width of 1 mm and the aperture length of 8 mm, which are disposed to be symmetric with respect to the center axis of the tubular vessel.

In Example 23, a plasma treatment apparatus of FIG. 9 was used, which is substantially same as the apparatus used in Example 1 other than the following features. The slit width and the slit length of the tubular vessel 1 are 1 mm and 56 mm, respectively. This apparatus has the treatment-effect uniform means (a). That is, the tubular vessel is formed such that the height of the tubular vessel 1 gradually increases towards the lateral opposite ends from the center of the laterally elongated cross section of the plasma outlet 12, as shown in FIG. 9. The heights ($H_E$) and ($H_C$) of the tubular vessel are 90 mm and 80 mm, respectively. The aperture width and length of the gas inlet 10 of the tubular vessel are 1 mm and 16 mm, respectively.

In Example 24, a plasma treatment apparatus of FIG. 14 was used, which is substantially same as the apparatus used in Example 1 other than the following features. The slit width, slit length, and the height of the tubular vessel 1 are 1 mm, 56 mm and 80 mm, respectively. This apparatus has the treatment-effect uniform means (d). That is, the tubular vessel has a pair of surface-roughened regions 16 each having a horizontal width of 10 mm on the inner surfaces of the front and rear walls, each of which extends from directly below the gas inlet 10 to directly above the plasma outlet 12 by a vertical distance. An average surface roughness of the surface-roughened region 16 is about 10 μm. The aperture width and length of the gas inlet 10 of the tubular vessel are 1 mm and 16 mm, respectively.

In Example 25, a plasma treatment apparatus of FIG. 7 was used, which is substantially same as the apparatus used in Example 18. The plasma uniform means of this apparatus works as the treatment-effect uniform means.

With respect to each of Examples 19 to 25, plasma made up of plural streamers was generated by supplying a mixture gas of 1.4 liter/min of helium, 7 liter/min of argon, and 0.28 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12. To make the streamers uniform, in Examples 19 to 23, the tubular vessel having the slit width of 1 mm and the gas inlet 10, which has an aperture area smaller than a cross-sectional area immediately below the gas inlet of the tubular vessel, was used as the plasma uniform means. In Example 24, in addition to the features of the tubular vessel used in Example 19, since the tubular vessel 1 has the surface-roughened regions, the flow of the streamer generation gas having the Reynolds number of 9370 (>1700) was obtained by the above-described supply amount of the streamer generation gas. In Example 25, the tubular vessel 1 having the turbulence generating member 6 disposed therein, and the slit width of 1 mm was used.

Figure 24:
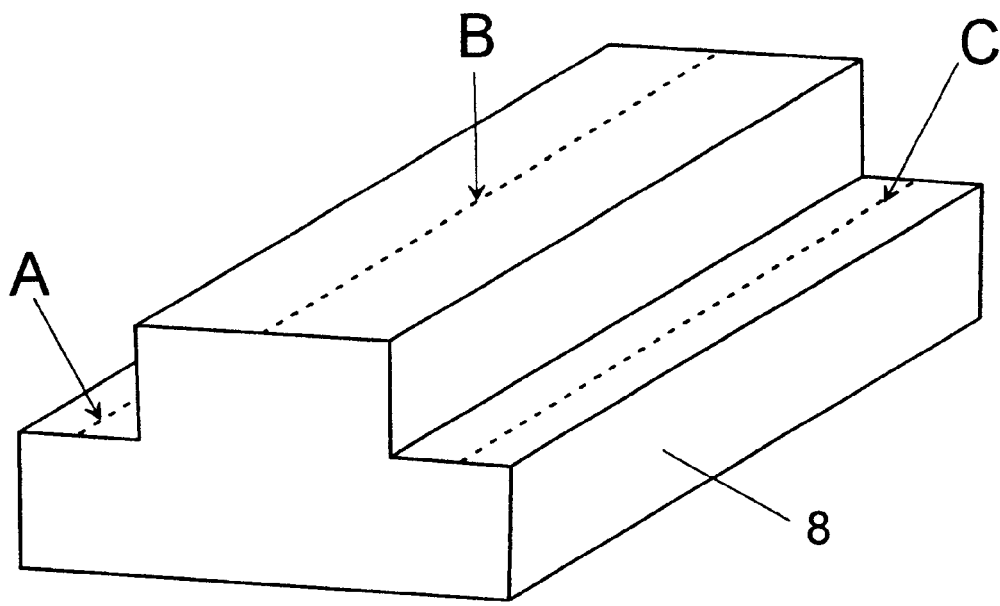
FIG. 24 is a schematic perspective view of an object used in Examples 19 to 25.

As an object to be treated, an epoxy-resin molded article having a convex cross section, as shown in FIG. 24. The plasma treatment was successively performed by transferring the object in its axial direction at the speed of 100 mm/sec under the condition that a distance between the plasma outlet and the object is 5 mm. As evaluations, a contact angle of water on the treated surface of the object was measured. That is, the measurement of the contact angle was performed at plural positions on each of three lines A, B and C defined on the object 8, as shown in FIG. 24, to calculate the mean value of contact angle. Results are shown in Table 8. The mean values of contact angle measured on the lines A, B and C prior to the plasma treatment were 93 degrees (A), 95 degrees (B) and 100 degrees (C), respectively.

TABLE 8

| | Contact angle on object (degrees) | | |
| --- | --- | --- | --- |
| | Line A | Line B | Line C |
| Before plasma treatment | 93 | 95 | 100 |
| Example 19 | 43 | 19 | 40 |
| Example 20 | 22 | 18 | 19 |
| Example 21 | 16 | 17 | 15 |
| Example 22 | 13 | 22 | 17 |
| Example 23 | 18 | 18 | 14 |

TABLE 8-continued

| | Contact angle on object (degrees) | | |
| --- | --- | --- | --- |
| | Line A | Line B | Line C |
| Example 24 | 15 | 12 | 11 |
| Example 25 | 21 | 18 | 17 |

As shown in Table 8, the surface treatment performed by use of the apparatus of Example 19 not having the treatment-effect uniform means resulted in a difference between the contact angles measured on the line B and on the contact angles measured on the lines A, C. On the other hand, in each of the surface treatments of Examples 20 to 25, since the plasma treatment apparatus has the treatment-effect uniform means, The range of variation in contact angle of water measured on the lines A to C was narrow. These result shows that it is preferred that the plasma treatment apparatus has the treatment-effect uniform means in the case of performing the plasma treatment to the object having a projection shown in FIG. 24.

Examples 26 to 31

In Examples 26 and 29, a plasma treatment apparatus of FIG. 3 was used, which is substantially same as the apparatus used in Examples 2 to 5. In Examples 27 and 30, a plasma treatment apparatus of FIG. 17A was used, which is substantially same as the apparatus used in Example 20. In Examples 28 and 31, a plasma treatment apparatus of FIG. 16 was used, which is substantially same as the apparatus used in Example 21.

With respect to each of Examples 26 to 31, plasma made up of plural streamers was generated by supplying a mixture gas of 1 liter/min of helium, 5 liter/min of argon, and 0.2 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12. To make the streamers uniform, in these Examples 26 to 31, the tubular vessel 1 having the slit width of 1 mm and the gas inlet 10, which has an aperture area smaller than the cross-sectional area immediately below the gas inlet of the tubular vessel, was used as the plasma uniform means.

Figure 25:
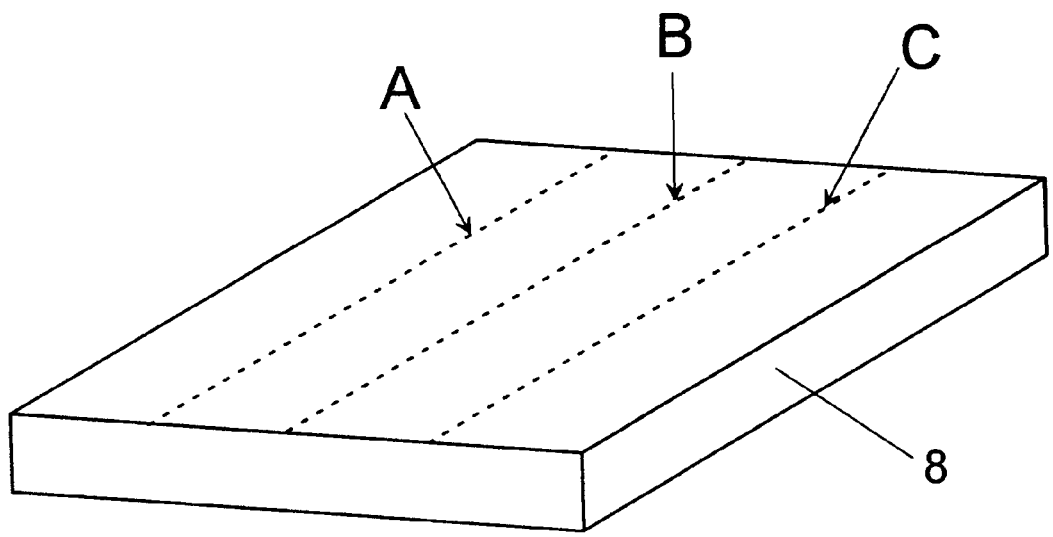
FIG. 25 is a schematic perspective view of an object used in Examples 26 to 31.

As an object, a polyimide film having a flat surface to be treated and a width of 55 mm, as shown in FIG. 25. The plasma treatment was successively performed by transferring the object in its axial direction at the speed of 30 mm/sec in a reel-to-reel manner. The distance (irradiation distance) between the plasma outlet 12 and the object 8 is 2 mm in Examples 26 to 28, and 10 mm in Examples 29 to 31.

After the plasma treatment, a contact angle of water on the treated surface of the object was measured. That is, the measurement of the contact angle was performed at plural positions on each of three lines A, B and C defined on the object 8, as shown in FIG. 25, to calculate the mean value of contact angle. Results are shown in Table 9. The mean values of contact angle measured on the lines A, B and C prior to the plasma treatment were 37 degrees (A), 40 degrees (B) and 38 degrees (C), respectively.

TABLE 9

| | Irradiation distance | Contact angle on object (degrees) | | | Deformation of film by irradiation heat |
|---|---|---|---|---|---|
| | | Line A | Line B | Line C | |
| Example 26 | 2 mm | 8 | 9 | 11 | slightly occurred |
| Example 27 | | 12 | 10 | 9 | slightly occurred |
| Example 28 | | 7 | 10 | 11 | slightly occurred |
| Example 29 | 10 mm | 18 | 12 | 20 | none |
| Example 30 | | 11 | 12 | 11 | none |
| Example 31 | | 10 | 12 | 11 | none |

As shown in Table 9, in Example 26, variations in contact angle of water on the lines A to C were minimized, but a slight deformation of the film was observed due to a thermal damage caused by the small irradiation distance (=2 mm). On the other hand, in Example 29, since the tubular vessel does not have the treatment-effect uniform means, and the irradiation distance is 10 mm, a relatively wide range of the variation of the contact angle of water was exhibited. In Examples, 27, 28, 30 and 31, since the tubular vessel has the treatment-effect uniform means, a narrow range of the variation of the contact angle of water was achieved even when the irradiation distance is 10 mm. In particular, in Examples 30 and 31, the variation was minimized without the occurrence of deformation of the film. Thus, it was confirmed that the use of the tubular vessel having the treatment-effect uniform means is effective to uniformly carry out the plasma treatment on the object.

Example 32

In this Example, a plasma treatment apparatus of FIG. 3 was used, which is substantially same as the apparatus used in Examples 2 to 5.

Plasma made up of plural streamers was generated by supplying a mixture gas of 2 liter/min of helium, 10 liter/min of argon, and 0.4 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12. To make the streamers uniform, the tubular vessel having the slit width of 1 mm and the gas inlet 10, which has an aperture area (16 mm²) smaller than the cross-sectional area (56 mm²) immediately below the gas inlet of the tubular vessel, was used as the plasma uniform means.

As an object, a circuit board having bonding pads, which was produced by screen-printing a palladium containing silver paste on an alumina substrate, and degreasing, sintering the printed substrate, was used. The plasma treatment was successively performed by transferring the object in a direction of 45 degrees relative to the lateral direction of the laterally elongated cross section of the tubular vessel at the speed of 5 mm/sec under a condition that a distance (irradiation distance) between the plasma outlet 12 and the object 8 is 5 mm.

After the plasma treatment, the bonding portions were analyzed by XPS. Peaks of silver oxide were observed before the plasma treatment. However, those peaks disappeared after the plasma treatment. This indicates that the silver oxide was reduced by the plasma treatment.

Examples 33 to 35

In Examples 33 and 34, a plasma treatment apparatus of FIG. 3 was used, which is substantially same as the apparatus used in Examples 2 to 5. In Example 35, a plasma treatment apparatus of FIG. 16 was used, which is substantially same as the apparatus used in Example 21.

With respect to Examples 33 to 35, plasma made up of plural streamers was generated by supplying 12 liter/min of a rare gas listed in Table 10, and 0.4 liter/min of oxygen as the streamer generation gas into the tubular vessel under atmospheric pressure, and applying an AC voltage (frequency: 13.56 MHz, applied electric power: 700 W) to the discharge space 7. The object 8 was treated with the plasma having a curtain-like shape injected from the plasma outlet 12. To make the streamers uniform, the tubular vessel having the slit width of 1 mm and the gas inlet 10, which has an aperture area smaller than the plasma outlet 12 was used as the plasma uniform means.

As an object having electrical conductivity, a copper plate was used. The plasma treatment was successively performed by transferring the object in a horizontal direction at the speed of 10 mm/sec under the condition that the distance (irradiation distance) between the plasma outlet 12 and the object 8 is 3 mm. During the plasma treatment, the presence or absence of arc discharge was observed. Results are shown in Table 10.

TABLE 10

| | He/Rare Gas (%) | Arc Discharge |
|---|---|---|
| Example 33 | 0 | Occurred |
| Example 34 | 5 | Not occurred |
| Example 35 | 0 | Not occurred |

As shown in Table 10, in Example 33, since the streamer generation gas does not contain helium, the occurrence of arc discharge was observed between the object and plasma injected from the plasma outlet. On the other hand, though the streamer generation gas not containing helium was used in Example 35, no arc discharge occurred. This indicates that the treatment-effect uniform means of Example 35 exhibits an effect of preventing the arc discharge.

Example 36

In this Example, a plasma treatment apparatus having a plasma ignition means was used, as shown in FIG. 20. The slit width, slit length and height of the tubular vessel 1 is 1 mm, 56 mm, and 80 mm, respectively, and the aperture width and length of the gas inlet 10 of the tubular vessel are 1 mm and 16 mm, respectively. In addition, an impedance matching device 80 was disposed between the power source 4 and the electrodes 2, 3. Moreover, a discharge lamp for emitting ultraviolet light such as a bactericidal lamp was used as the plasma ignition means, which is disposed in parallel to a side of the electrode 3. The other components are the same as Example 1.

Plasma made up of plural streamers was generated by supplying 2 liter/min of helium, 10 liter/min of argon, and 0.4 liter/min of oxygen as the streamer generation gas into the tubular vessel under atmospheric pressure, and applying an AC voltage (frequency: 13.56 MHz, applied electric power: 400 W) to the discharge space 7. The object 8 was treated with the plasma having a curtain-like shape injected from the plasma outlet 12. To make the streamers uniform, the tubular vessel having the slit width of 1 mm and the gas inlet 10, which has an aperture area smaller than the plasma outlet 12, was used as the plasma uniform means.

When light of the discharge lamp 70 was emitted to the discharge space 7, the discharge can be started by applying 3 kV to the discharge space 7 by the power source 4. On the other hand, when the bactericidal lamp 70 was not used, a high voltage of 5 kV or more had to be applied to the discharge space to start the generation of discharge. These results show that the use of the plasma ignition means is effective to remarkably decrease the voltage to be applied to the discharge space. That is, by irradiating ultraviolet light of the bactericidal lamp 70 to the discharge space 7 under the condition that the AC or pulse voltage is applied to the electrodes 2, 3 by use of the power source 4, it is possible to increase amounts of electrons in the discharge space. As a consequence, spark discharge can be easily generated in the discharge space. The generation of spark discharge induces the ignition of streamers.

Example 37

In this Example, a plasma treatment apparatus of FIG. 16 was used, which is substantially same as the apparatus used in Examples 21.

Plasma made up of plural streamers was generated by supplying 2 liter/min of helium, 10 liter/min of argon, and 0.4 liter/min of oxygen as the streamer generation gas into the tubular vessel under atmospheric pressure, and applying a pulse voltage described below to the discharge space 7. The object 8 was treated with the plasma having a curtain-like shape injected from the plasma outlet 12. To make the streamers uniform, the streamer generation gas was supplied into the tubular vessel such that a flow velocity of the streamer generation gas in the axial direction of the tubular vessel is 5 m/sec or more, and the tubular vessel having the slit width of 1 mm and the gas inlet 10, which has an aperture area (24 mm$^2$) smaller than a cross-sectional area (85 mm$^2$) immediately below the gas inlet of the tubular vessel, was used as the plasma uniform means.

Figure 26:
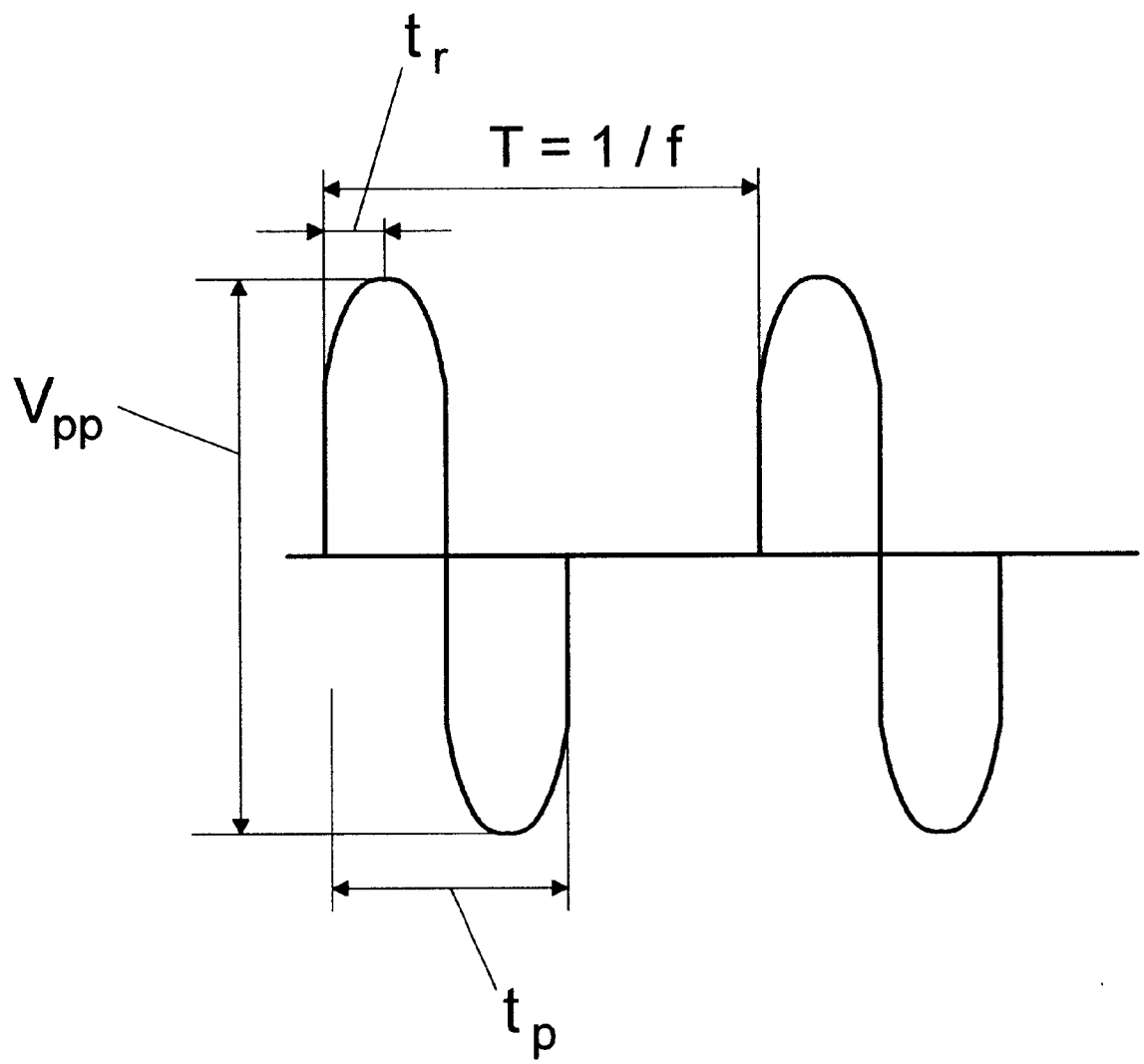
FIG. 26 is a waveform diagram of a pulse voltage applied in Example 37.

A waveform of the applied pulse voltage is shown In FIG. 26. The frequency ($f_r$) and period (T) of the pulse voltage are 120 kHz and 8.3 $\mu$sec. In addition, the rising time ($t_r$), pulse width ($t_p$) and the peak-to-peak voltage ($V_{pp}$) are 70 nsec, 280 nsec, and 5.5 kV, respectively.

As the object, a silicon wafer having a negative-type resist film of 1-$\mu$m thickness thereon was used. After the plasma treatment, a measurement of etching depth of the resist film was carried out. The mean value of etching depth was 450 Å.

As described above, the present invention has achieved success in uniformly treating the object at a high treatment speed with plasma made up of the plural streamers. That is, by using the plasma treatment apparatus having the plasma uniform means and/or performing the plasma treatment method comprising the plasma uniform step of the present invention, it is possible to make plural streamers generated in the tubular vessel uniform in the lateral direction of the laterally elongated cross section thereof.

Therefore, the plasma treatment apparatus and method of the present invention are useful to remove foreign substances such as organic substances from objects to be treated, strip resists, improve adhesion of organic films, perform surface modification, film formation, etching treatment, reduce metal oxides, or clean glass substrates for liquid crystal. In particular, they will be preferably used to perform surface cleaning or surface modification to electronic parts and semiconductor parts, which need precise connections in semiconductor manufacturing process.

What is claimed is:

1. A plasma treatment apparatus for treating an object with plasma comprising:

a tubular vessel made of an electrically-insulating material and having a laterally elongated cross section, which has a gas inlet at its one end and a plasma outlet at the other end;

a pair of electrodes, which are arranged such that electric flux lines develop substantially in an axial direction of said tubular vessel when one of an AC voltage and a pulse voltage is applied between said electrodes;

a gas supply for supplying a streamer generation gas into said tubular vessel though said gas inlet;

a power source for applying said one of the AC voltage and the pulse voltage between said electrodes to generate plural streamers of said gas in said tubular vessel; and a plasma uniform means for making the plural streamers uniform in a lateral direction of the laterally elongated cross section of said tubular vessel to provide said plasma from said plasma outlet.

2. The plasma treatment apparatus as set forth in claim 1, wherein said plasma uniform means is provided by said tubular vessel formed such that an aperture area of said gas inlet is smaller than a cross-sectional area immediately below said gas inlet of said tubular vessel.

3. The plasma treatment apparatus as set forth in claim 1, wherein said plasma uniform means is a turbulence generating member disposed in said tubular vessel, which has a shape capable of generating a turbulence of said streamer generation gas in said tubular vessel.

4. The plasma treatment apparatus as set forth in claim 1, wherein said plasma uniform means is provided by said tubular vessel formed such that the laterally elongated cross section of said tubular vessel has an inner width of 1 to 5 mm.

5. The plasma treatment apparatus as set forth in claim 1, wherein said pair of electrodes are a pair of ring-like electrodes, which are arranged around said tubular vessel such that one of the ring-like electrodes is spaced from the other one in the axial direction of said tubular vessel by a distance of 2 mm or more and less than 20 mm.

6. The plasma treatment apparatus as set forth in claim 1 comprising a treatment-effect uniform means for facilitating the uniformity of plasma-treatment effects on said object.

7. The plasma treatment apparatus as set forth in claim 6, wherein said treatment-effect uniform means is provided by said tubular vessel formed such that a height of said tubular vessel changes in said lateral direction of the laterally elongated cross section of said tubular vessel with reference to unevenness of a surface to be treated of said object.

8. The plasma treatment apparatus as set forth in claim 6, wherein said treatment-effect uniform means is provided by said tubular vessel having at least two of said gas inlet formed such that said streamer generation gas injected from said plasma outlet has a flow velocity distribution determined according to unevenness of a surface to be treated of said object.

9. The plasma treatment apparatus as set forth in claim 6, wherein said treatment-effect uniform means is provided by said tubular vessel formed such that a cross-sectional area perpendicular to the axial direction of said tubular vessel changes in the axial direction thereof.

10. The plasma treatment apparatus as set forth in claim 9, wherein said tubular vessel is formed with a pair of front and rear walls having an isosceles-trapezoid shape and a pair of side walls.

11. The plasma treatment apparatus as set forth in claim 6, wherein said treatment-effect uniform means is provided by said tubular vessel having a surface-roughened region formed on its inner surface such that said streamer generation gas injected from said plasma outlet has a flow velocity distribution determined according to unevenness of a surface to be treated of said object.

12. The plasma treatment apparatus as set forth in claim 6, wherein said treatment-effect uniform means is provided by said tubular vessel having a cross-sectional shape perpendicular to the axial direction thereof formed such that said streamer generation gas injected from said plasma outlet has a flow velocity distribution determined according to unevenness of a surface to be treated of said object.

13. The plasma treatment apparatus as set forth in claim 6, wherein said tubular vessel is formed with a pair of first walls of an isosceles-trapezoid shape and a pair of second walls of a rectangular shape, so that a cross-sectional area perpendicular to the axial direction of said tubular vessel gradually decreases towards said plasma outlet, and wherein an angle defined between the axial direction of said tubular vessel and said second wall is within a range of 2 to 30 degrees.

14. The plasma treatment apparatus as set forth in claim 6, wherein the laterally elongated cross section of said tubular vessel has width, which is wider towards lateral opposite ends than at the center thereof, and a ratio of a center width ($S_{WC}$) and an end width ($S_{WE}$) is $0.8 \leq S_{WC}/S_{WE} < 1$.

15. The plasma treatment apparatus as set forth in claim 1 comprising a plasma ignition means for starting the generation of plural streamers in said tubular vessel.

16. A plasma treatment method comprising the steps of:
   supplying a streamer generation gas into a tubular vessel made of an electrically-insulating material and having a laterally elongated cross section, which has a gas inlet at its one end and a plasma outlet at the other end;
   generating plural streamers under atmospheric pressure or a pressure near the atmospheric pressure in said tubular vessel by applying one of an AC voltage and a pulse voltage between a pair of electrodes arranged such that electric flux lines develop substantially in an axial direction of the tubular vessel;
   distributing the plural streamers uniformly in a lateral direction of the laterally elongated cross section of said tubular vessel to obtain plasma in said tubular vessel; and
   treating an object with said plasma provided from said plasma outlet of said tubular vessel.

17. The plasma treatment method as set forth in claim 16, wherein said step of making the plural streamers uniform is performed by supplying said streamer generation gas into said tubular vessel such that a flow of said streamer generation gas in said tubular vessel has a Reynolds number of 1700 or more under non-discharge condition.

18. The plasma treatment method as set forth in claim 16, wherein said step of making the plural streamers uniform is performed by supplying said streamer generation gas into said tubular vessel such that a flow velocity of said streamer generation gas in the axial direction of said tubular vessel is 5 m/sec or more.

19. The plasma treatment method as set forth in claim 16, wherein said streamer generation gas contains a rare-gas.

20. The plasma treatment method as set forth in claim 19, wherein said rare gas is argon.

21. The plasma treatment method as set forth in claim 20, wherein said streamer generation gas contains 30 vol % or more of argon.

22. The plasma treatment method as set forth in claim 16, wherein said streamer generation gas contains 1 vol % or more of an oxidative gas by oxygen conversion.

23. The plasma treatment method as set forth in claim 16, wherein said streamer generation gas contains 1 vol % or more of hydrogen.

24. The plasma treatment method as set forth in claim 16, wherein said streamer generation gas contains 3 vol % or more of helium.

25. A plasma treatment apparatus for treating an object with a plasma, comprising:
   a tubular vessel made of an electrically-insulating material and having a gas inlet at its one end and a plasma outlet at the other end;
   a pair of electrodes arranged such that electric flux lines develop substantially in an axial direction of said tubular vessel when one of an AC voltage and a pulse voltage is applied between said electrodes;
   a gas supply configured to supply a plasma generation gas into said tubular vessel through said gas inlet;
   a power source configured to apply one of an AC voltage and a pulse voltage between said electrodes to generate the plasma of said gas in said tubular vessel; and
   a treatment-effect uniformity device configured to promote the uniformity of a plasma-treatment on said object.

26. The plasma treatment apparatus according to claim 25, wherein said treatment-effect uniformity device is configured to generate plural streamers of a streamer generation gas under atmospheric pressure or a pressure near the atmospheric pressure in a tubular vessel, and to make the plural streamers uniform in a direction perpendicular to an axial direction of said tubular vessel.

* * * * *